(12) United States Patent
Roblin et al.

(10) Patent No.: US 12,658,855 B2
(45) Date of Patent: Jun. 16, 2026

(54) SINGLE-INPUT BROADBAND DOHERTY-HDmax CONTINUUM POWER AMPLIFIER

(71) Applicant: Ohio State Innovation Foundation, Columbus, OH (US)

(72) Inventors: Patrick Roblin, Columbus, OH (US); Chenyu Liang, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 632 days.

(21) Appl. No.: 18/082,928

(22) Filed: Dec. 16, 2022

(65) Prior Publication Data

US 2023/0198471 A1 Jun. 22, 2023

Related U.S. Application Data

(60) Provisional application No. 63/290,151, filed on Dec. 16, 2021.

(51) Int. Cl.
H03F 1/02 (2006.01)
H03F 1/56 (2006.01)
(Continued)

(52) U.S. Cl.
CPC ............. H03F 1/0288 (2013.01); H03F 1/56 (2013.01); H03F 3/245 (2013.01); H03F 3/602 (2013.01);
(Continued)

(58) Field of Classification Search
CPC ...... H03F 1/0288; H03F 1/0227; H03F 3/195; H03F 3/245; H03F 2200/451;
(Continued)

(56) References Cited

U.S. PATENT DOCUMENTS

2013/0343107 A1* 12/2013 Perreault ................. H03F 3/211
363/67
2024/0063756 A1* 2/2024 Hua ........................ H03F 1/565

FOREIGN PATENT DOCUMENTS

CN 114978045 A * 8/2022 ............... H03F 1/56
CN 115694372 A * 2/2023
CN 110855251 B * 4/2023 ........... H03F 1/3241

OTHER PUBLICATIONS

W. H. Doherty, "A new high efficiency power amplifier for modulated waves," Proc. IRE, vol. 24, pp. 1163-1182, Sep. 1936.
(Continued)

*Primary Examiner* — Hafizur Rahman
(74) *Attorney, Agent, or Firm* — Meunier Carlin & Curfman LLC

(57) ABSTRACT

Described herein is a single-input hybrid Doherty power amplifier (PA). Unlike the conventional λ/4 Doherty PA inverter which only performs the correct load modulation at its center frequency, the hybrid Doherty PA (HDω-PA) combiner network achieves a wideband load modulation using the frequency dependence of the electrical length of the output combiner lines versus frequency for sliding the PA mode of operation. A modified theory is presented herein to allow for a single-input PA implementation. In this design, the outphasing angle is only changing with frequency and not the input power. A transmission line phase shifter is used to provide the correct frequency-dependent input phase offset ensuring the correct wideband load modulation performed by the output combiner.

14 Claims, 42 Drawing Sheets

1100

(51) Int. Cl.
    *H03F 3/24*         (2006.01)
    *H03F 3/60*         (2006.01)

(52) U.S. Cl.
    CPC .. *H03F 2200/255* (2013.01); *H03F 2200/423*
                      (2013.01)

(58) Field of Classification Search
    CPC ...... H03F 2200/541; H03F 1/56; H03F 3/602;
                 H03F 2200/255; H03F 2200/423; H04B
                       1/0458; H04B 2001/0408
    USPC ..................................................... 330/124 R
    See application file for complete search history.

(56)                   References Cited

OTHER PUBLICATIONS

F. H. Raab, "Efficiency of Doherty RF power-amplifier systems," IEEE Transcation on Broadcasting, vol. BC-33, pp. 77-83, Sep. 1987.

J. M. Rubio et al.,"3-3.6-GHz wideband GaN Doherty power amplifier exploiting output compensation stages," IEEE Trans. Microw. Theory Techn., vol. 60, No. 8, pp. 2543-2548, Aug. 2012.

X. Fang, A. Chung and S. Boumaiza, "Linearity-enhanced Doherty power amplifier using output combining network with predefined AM-PM characteristics," IEEE Trans. Microw. Theory Techn., vol. 67, pp. 195-204, Jan. 2019.

X. Fang, H. Liu, K. M. Cheng and S. Boumaiza, "Two-way Doherty power amplifier efficiency enhancement by incorporating transistors" nonlinear phase distortion, IEEE Microwave and Wireless Components Letters, vol. 28, No. 2. pp. 168-170, Feb. 2018.

M. Li, J. Pang, Y. Li and A. Zhu, "Bandwidth enhancement of Doherty power amplifier using modified load modulation network," IEEE Trans. Circuits. Syst. I, Reg. Papers., vol. 67, No. 6, pp. 1824-1834, Jun. 2020.

J. Pang, Y. Li, C. Chu, J. Peng, X. Y. Zhou and A. Zhu, "Extend high efficiency range of Doherty power amplifier by modifying charac-teristic impedance of transmission lines in load modulation net-work," IEEE 2020 IEEE/MTT-S International Microwave Sympo-sium (IMS),2020.

X. Y. Zhou et al., "Broadband efficiency-enhanced mutually coupled harmonic postmatching Doherty power amplifier," IEEE Trans. Circuits. Syst. I, Reg. Papers., vol. 64, No. 7, pp. 1758-1771, Jul. 2017.

C. M. Andersson, D. Gustafsson, J. C. Cahuana, R. Hellberg and C. Fager. "A 1-3-GHz digitally controlled dual-RF input power-amplifier design based on a Doherty-outphasing continuum analy-sis," IEEE Trans. Microw. Theory Techn., vol. 61, No. 10, 2013.

C. Liang, P. Roblin, Y. Hahn, Z. Popovic and H. C. Chang. "Novel outphasing power amplifiers designed with an analytic generalized Doherty-Chireix continuum theory," IEEE Trans. Circuits. Syst. I, Reg. Papers., vol. 66, No. 8, 2019.

C. Liang, J. I. Martinez-Lopez, P. Roblin, Y. Hahn, D. Mikrut and V. Chen. "Wideband two-way hybrid Doherty outphasing power amplifier," IEEE Trans. Microw. Theory Techn., vol. 69, No. 2, 2021.

P. J. Tasker and J. Benedikt, "Waveform inspired models and the harmonic balance emulator," IEEE Microw. Magazine., vol. 12, issue. 2, pp. 38-54, Apr. 2011.

H. Jang, P. Roblin and Z. Xie. "Model-based nonlinear embedding for power amplifier design," IEEE Trans. Microw. Theory Techn., vol. 62, No. 9, 2014.

C. Liang, T. Niubo-Aleman, Y. Hahn, P. Roblin and J. A. Hernandez, "Optimal two-way hybrid Doherty-Outphasing power amplifier," IEEE RF/Microw. Power Amplifiers for Radio and Wireless Appli-cations (PAWR)., Jan. 2020.

H. C. Chang, Y. Hahn, p. Roblin and T. W. Barton, "New mixed-mode design methodology for high-efficiency outphasing Chireix amplifiers," IEEE Trans. Circuits. Syst. I, Reg. Papers., vol. 66, pp. 1594-1607, 2019.

H. Lyu, Y. Cao and K. Chen, "Linearity-enhanced and highly efficient Doherty power amplifier: 16th high efficiency power ampli-fier student design competition," IEEE Microw. Magazine., vol. 22, No. 2, pp. 62-69, Oct. 2021. Abstract.

* cited by examiner

100

200

300

310

320

330

400

510

520

530

540

550

560

610

620

630

640

650

660

710

720

810

820

830

900

1000

1200

1310

1320

1410

1420

1510

1520

1610

1620

1710

1720

1730

1740

1750

1760

SINGLE-INPUT BROADBAND DOHERTY-HDmax CONTINUUM POWER AMPLIFIER

CROSS-REFERENCE TO RELATED APPLICATIONS

This application claims priority to U.S. Provisional Patent Application No. 63/290,151, filed on Dec. 16, 2021, entitled "SINGLE-INPUT BROADBAND DOHERTY-HDMAX CONTINUUM POWER AMPLIFIER." The content of which is hereby incorporated by reference in its entirety.

STATEMENT OF GOVERNMENT SUPPORT

This invention was made with government support under grant/contract number 1952907 awarded by the National Science Foundation. The government has certain rights in the invention.

BACKGROUND

Doherty power amplifiers (PAs) continue to draw attention from PA designers due to their enhanced back-off power efficiency and simple circuit topology. They have been widely adopted in wireless transmitter systems and are still a popular choice for the fifth-generation or beyond of wireless base station infrastructures. Conventional Doherty PAs rely on the load modulation technique to maintain high efficiency from backoff to peak power level. The load modulation scheme depends on a quarter-wave transmission line (TL), which is inherently narrowband. A narrowband Doherty PA output combiner was developed based on a "black-box" type of a two-port network to facilitate the design process. Recently, there have been numerous efforts to extend the bandwidth of Doherty PAs. In one example, a post harmonic matching network is designed to create the harmonic load modulation between main and auxiliary PAs, resulting in a broadband Doherty PA operation. In another example an additional TL is incorporated at the auxiliary PA branch to obtain the desired AM-PM performance within a large bandwidth. In another example, two extra TLs are inserted in the main and auxiliary PA branches to keep the backoff impedance seen by the main PA constant across the frequency band. There have also been many other advanced load modulation techniques proposed to break through PA bandwidth limitation. In particular, the distributed efficient and the load-modulated balanced amplifier have been showing promising wideband performance.

SUMMARY

Described herein is a single-input hybrid Doherty power amplifier (PA). Unlike the conventional 214 Doherty PA inverter which only performs the correct load modulation at its center frequency, the hybrid Doherty PA (HD$\omega$-PA) combiner network achieves a wideband load modulation using the frequency dependence of the electrical length of the output combiner lines versus frequency for sliding the PA mode of operation. A modified theory is presented herein to allow for a single-input PA implementation. In this new design, the outphasing angle is changing with frequency and not the input power. A transmission line phase shifter is used to provide the correct frequency-dependent input phase offset ensuring the correct wideband load modulation performed by the output combiner. A methodology is also described to select the optimal input phase offset to reduce the variation in the saturation power versus frequency and minimize the circuit size. A proof-of-concept demonstrator PA circuit is designed to operate from 2.5 to 3.3 GHz. When the fabricated PA is excited by a 20-MHz long-term evolution (LTE) modulated signal with 6-dB peak-to-average-power ratio (PAPR), an average efficiency of 45%-59% and adjacent channel leakage ratio (ACLR) less than −50 dBc are achieved after digital predistortion (DPD).

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The components in the drawings are not necessarily to scale relative to each other. Like reference numerals designate corresponding parts throughout the several views.

DETAILED DESCRIPTION

The following description of the disclosure is provided as an enabling teaching of the disclosure in its best, currently known embodiment(s). To this end, those skilled in the relevant art will recognize and appreciate that many changes can be made to the various embodiments of the invention described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Unless defined otherwise, all technical and scientific terms used herein have the same meaning as commonly understood to one of ordinary skill in the art to which this invention belongs. As used in the specification and claims, the singular form "a," "an," and "the" include plural references unless the context clearly dictates otherwise. As used herein, the terms "can," "may," "optionally," "can optionally," and "may optionally" are used interchangeably and are meant to include cases in which the condition occurs as well as cases in which the condition does not occur. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein. Publications cited herein are hereby specifically incorporated by reference in their entireties and at least for the material for which they are cited.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

Wideband Single-Input Hybrid Doherty Continuum PA Design Theory

Figure 1:
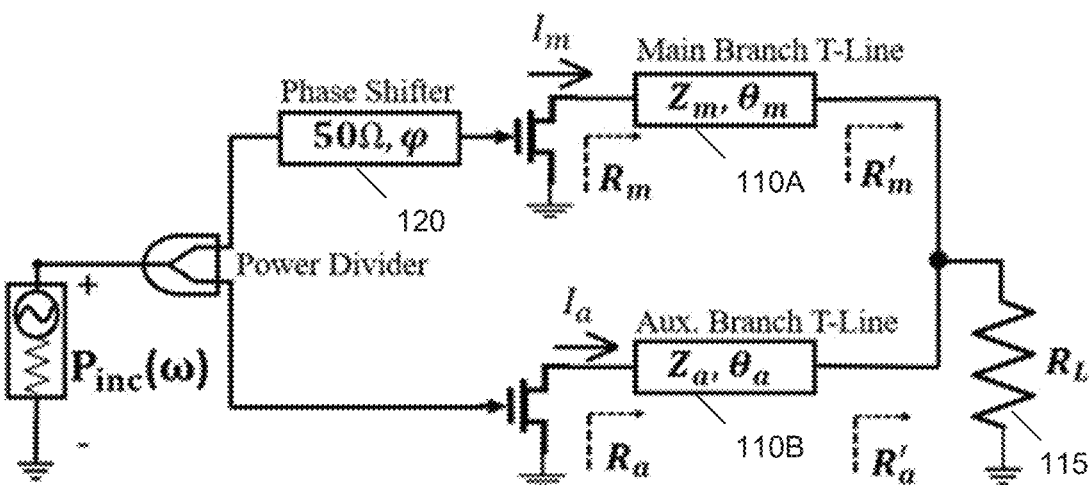
FIG. 1 is a conceptual diagram of the proposed single-input hybrid Doherty PA 100.

The conceptual diagram for the proposed single-input HDω-PA is shown in the circuit 100 of FIG. 1. Note that this prototype HDω-PA circuit 100 presents the targeted operation at the current-source reference planes (CSRPs) for both the main and auxiliary transistor IV characteristics represented by the field effect-transistor symbols as shown in the circuit 200 of FIG. 2. The proposed HDω-PA output combiner prototype consists of two TLs 110 (i.e., 110A and 110B) with the characteristic impedance of $Z_m$ and $Z_a$ and electrical length of $\theta_m(\omega)$ and $\theta_a(\omega)$, respectively. The common load $R_L$ 115 connected in between the lines assists with the load modulation while delivering the output power. The main and auxiliary transistors are operating in class AB (or class B) and C modes with the second-harmonic current shorted, respectively. The gate of the transistors is driven by two voltage sources, with the one on the main side phase shifted by the outphasing angles 9 relatively. For the single-input HDω-PA 100 discussed in this work, a 50-Ω TL with electrical length $\theta(\omega)$ is inserted to function as a frequency-dependent phase shifter 120.

Design of the Phase Sliding-Mode Output Combiner

A design parameter introduced in the DohertyChireix/ Outphasing continuum solutions is the peak-to-backoff drain voltage ratio of the auxiliary PA. It is defined as $K_{va}=|V_{ap}|/|V_{ab}|$, where the subscript a refers to the auxiliary PA, and the subscripts p and b refer to the peak and backoff power levels, respectively. For the theoretical analysis presented herein, the auxiliary PA is fully turned off below backoff power, and thus, the peak-to-average drain current ratio of the auxiliary PA is very large and taken as infinity: $K_{ia}=|I_{ap}|/|I_{ab}|=\infty$. The asymmetry power ratio between the main and auxiliary PAs n simplifies to:

$$n(\omega) = K_{va}(\omega)\frac{OBO - 1}{OBO + K_{va}(\omega)} \tag{1}$$

In equation (1) OBO is defined as the output backoff power range. Different from previous PAs, where the OBO is set to be varying from 6 to 9.54 dB versus frequency, the OBO here is set to remain constant at 8 dB versus frequency. This requires a slight variation in the output load $R_L$ and peak auxiliary load $R_{ap}$ versus frequency. The line electrical lengths $\theta_m$ and $\theta_a$, and the input phase offset $\theta$ will be expressed in terms $K_{va}$ to accommodate the single-input Doherty PA design. The characteristic impedances for the TLs-$Z_m$,$Z_a$, and the output load $R_L$- are selected to maintain a broadband operation at peak power:

$$Z_m = R_{mp} \tag{2}$$

$$Z_a(\omega) = R_{ap}(\omega)$$

$$R_L(\omega) = \frac{R_{mp}}{n(\omega) + 1} = \frac{R_{mp}(OBO/K_{va}(\omega) + 1)}{OBO - 1}$$

where $R_{mp}$ and $R_{ap}(\omega)$ refer to the loads at CSRP to be provided at peak power seen by the main and auxiliary devices, respectively.

The dual-input PA outphasing angles at backoff $\theta_b$ and peak power level $\theta_p$ are expressed in terms of only $K_{va}$ and OBO with $K_{ia}=\infty$, yielding:

$$\theta_b(\omega) = \pm\cos^{-1}\left(\pm\sqrt{\frac{OBO - K_{va}^2(\omega)}{OBO + 2K_{va}(\omega) + 1}}\right). \qquad (3)$$

$$\theta_p(\omega) = \pi - \theta_b(\omega)$$

For each value of $K_{va}$, there exists four possible combinations (eight solutions) for the input phase offset angles based on equation (3):

$$\theta_{b1} = \cos^{-1}\left(\sqrt{\frac{OBO - K_{va}^2(\omega)}{OBO + 2K_{va}(\omega) + 1}}\right); \theta_{p1} = \pi - \theta_{b1}$$

$$\theta_{b2} = \cos^{-1}\left(-\sqrt{\frac{OBO - K_{va}^2(\omega)}{OBO + 2K_{va}(\omega) + 1}}\right); \theta_{p2} = \pi - \theta_{b2}$$

$$\theta_{b3} = -\cos^{-1}\left(\sqrt{\frac{OBO - K_{va}^2(\omega)}{OBO + 2K_{va}(\omega) + 1}}\right); \theta_{p3} = \pi - \theta_{b3}$$

$$\theta_{b4} = -\cos^{-1}\left(-\sqrt{\frac{OBO - K_{va}^2(\omega)}{OBO + 2K_{va}(\omega) + 1}}\right); \theta_{p4} = \pi - \theta_{b4}$$

The electrical lengths $\theta_m$ and $\theta_a$ in FIG. 1 are simplified and expressed in terms of $K_{va}$ and OBO as:

$$\theta_m(\omega) = \tan^{-1}\left(\frac{K_{va}(\omega) + OBO}{K_{va}(\omega) + 1}\tan\theta_b(\omega)\right) \qquad (4)$$

$$\theta_a(\omega) = \tan^{-1}\left(\frac{K_{va}(\omega) = \dfrac{OBO}{K_{va}(\omega)}}{K_{va}(\omega) + 1}\tan\theta_b(\omega)\right). \qquad (5)$$

Having established the relationships between the electrical lengths $\theta_m(\omega)$ and $\theta_a(\omega)$, the targeted OBO and $K_{va}(\omega)$ from equation (4) and equation (5), the frequency dependence for $K_{va}(\omega)$ can be theoretically obtained to yield frequency-dependent solution for the TL electrical lengths $\theta_m(\omega)$ and $\theta_a(\omega)$. First, by selecting the desired extreme $K_{va}(\omega_{min})$ and $K_{va}(\omega_{max})$, equation (3) and equation (4) can be used to determine the boundary conditions $\theta_m(\omega_{min})$ and $\theta_m(\omega_{max})$ for the targeted OBO. One can then assume a linear dispersion for the main TL electrical length $\theta_m(\omega)$ as $\omega$ varies from $\omega_{min}$ to $\omega_{max}$ as:

$$\theta_m(\omega) = (1 - \alpha)\theta_m(\omega_{min}) + \alpha\theta_m(\omega_{max}) \qquad (6)$$

where $\alpha=(\omega-\omega_{min})/(\omega_{max}-\omega_{min})$ varies from 0 to 1 with frequency. Equation (3) can then be reformulated to:

$$\tan^2\theta_b = (K_{va} + 1)^2/(-K_{va}^2 + OBO).$$

Starting from (4), a quadratic equation for $K_{va}$ is formed in terms of OBO and $\theta_m(\omega)$, which is given by:

$$(\tan^2\theta_m + 1)K_{va}^2 + 2OBOK_{va} + OBO(OBO - \tan\theta_m^2) = 0.$$

This quadratic equation admits for solution:

$$K_{va}(\theta_m, OBO) = \frac{-b + \sqrt{b^2 - 4ac}}{2a} \text{ with} \qquad (7)$$

$$a = \tan\theta_m^2 + 1$$
$$b = 2OBO$$
$$c = OBO(OBO - \tan\theta_m^2)$$

Taking the ratio of (5) by (4), the required dispersion $\theta_a(\omega)$ for the auxiliary TL, which might be slightly nonlinear, is then given by $$\tan\theta_a(\omega) = \tan\theta_m(\omega)\frac{K_{va}(\omega) - OBO/K_{va}(\omega)}{K_{va}(\omega) + OBO} \qquad (8)$$

Figure 8A:
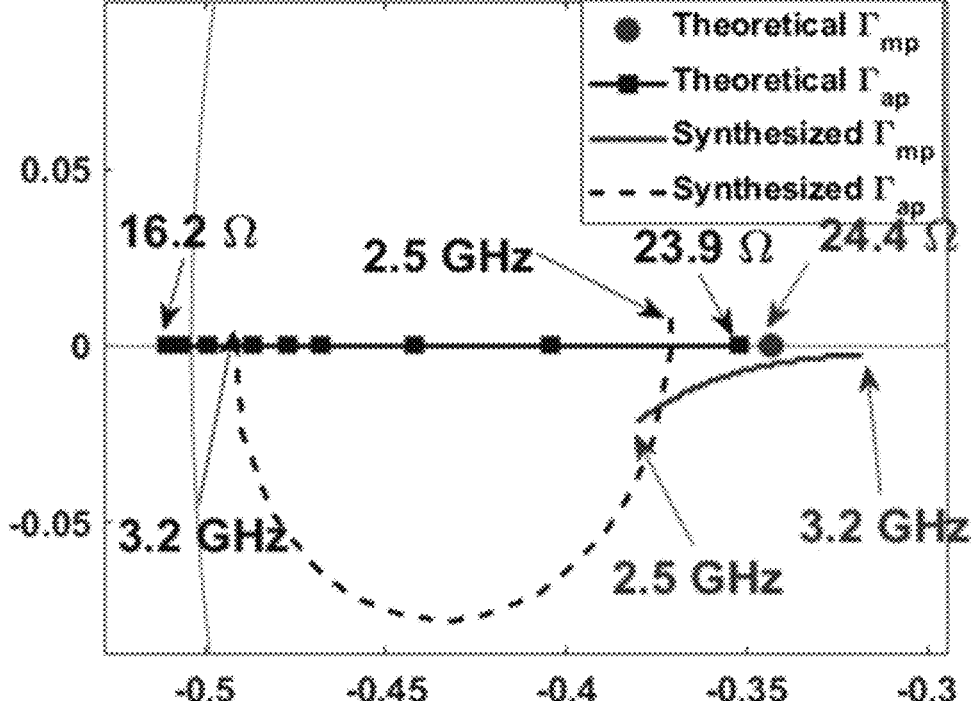
FIG. 8A is a graph 810 of synthesized load impedances seen by the main and auxiliary devices on the zoomed-in Smith chart.
Figure 8B:
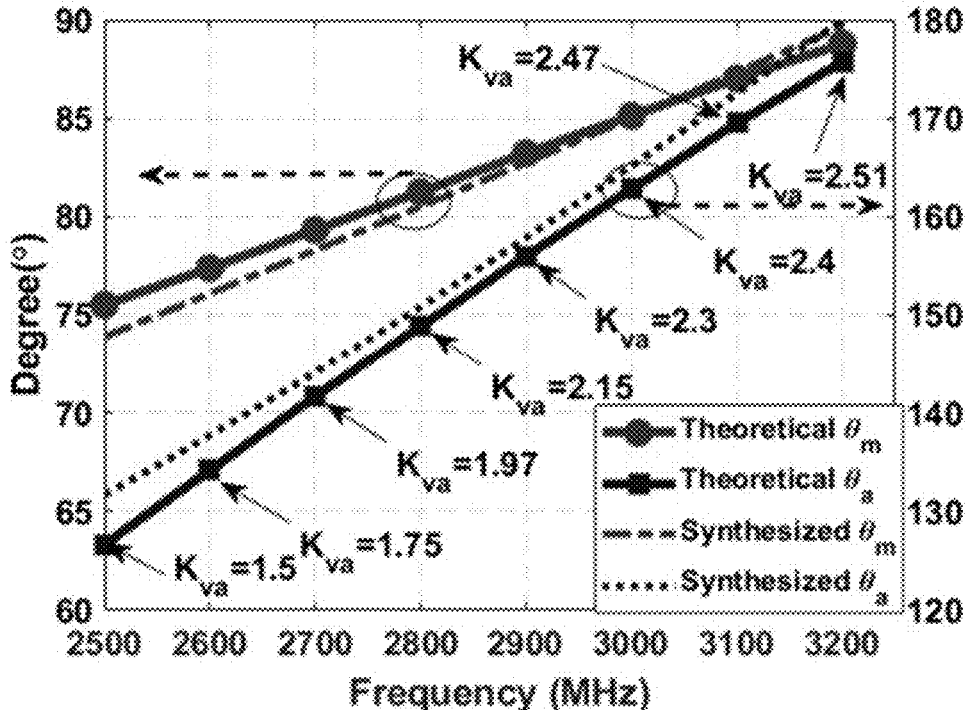
FIG. 8B is a graph 820 of synthesized electrical length of the output matching networks.

In some embodiments, OBO is fixed to 8 dB and $K_{va}(\omega)$ is calculated to be {1.50,1.75,1.97,2.15,2.30,2.40,2.47,2.51} as the frequency linearly increases from 2.5 to 3.2 GHz based on equation (7) and equation (6). The resulting electrical lengths $\theta_m(\omega)$ and $\theta_a(\omega)$ from equation (6) and equation (8), shown as dots and rectangles in the graph 820 of FIG. 8B, are found to be quasi-linear functions of frequency as desired to closely fit the phase dispersion of the transmission line-based output matching networks.

Figure 2:
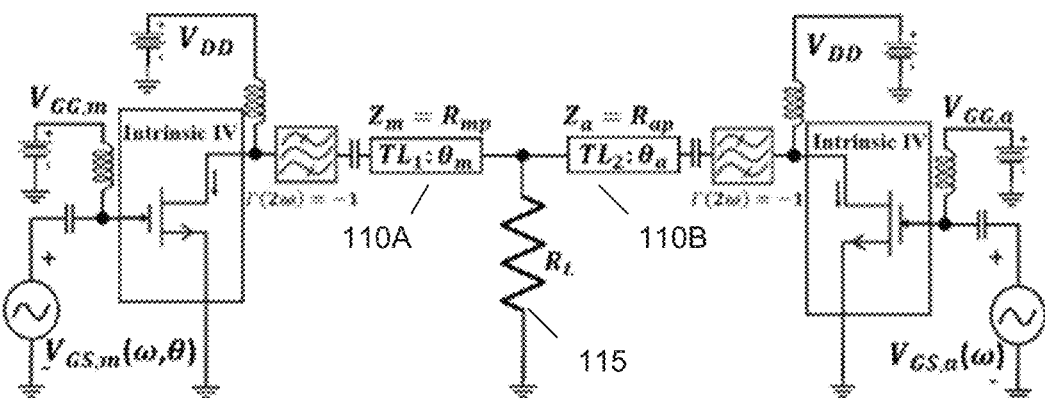
FIG. 2 is a simulation schematic of the dual-input PA 200 built with the nonlinear embedding device intrinsic IV model and TL-based output combiner.
Figure 3A:
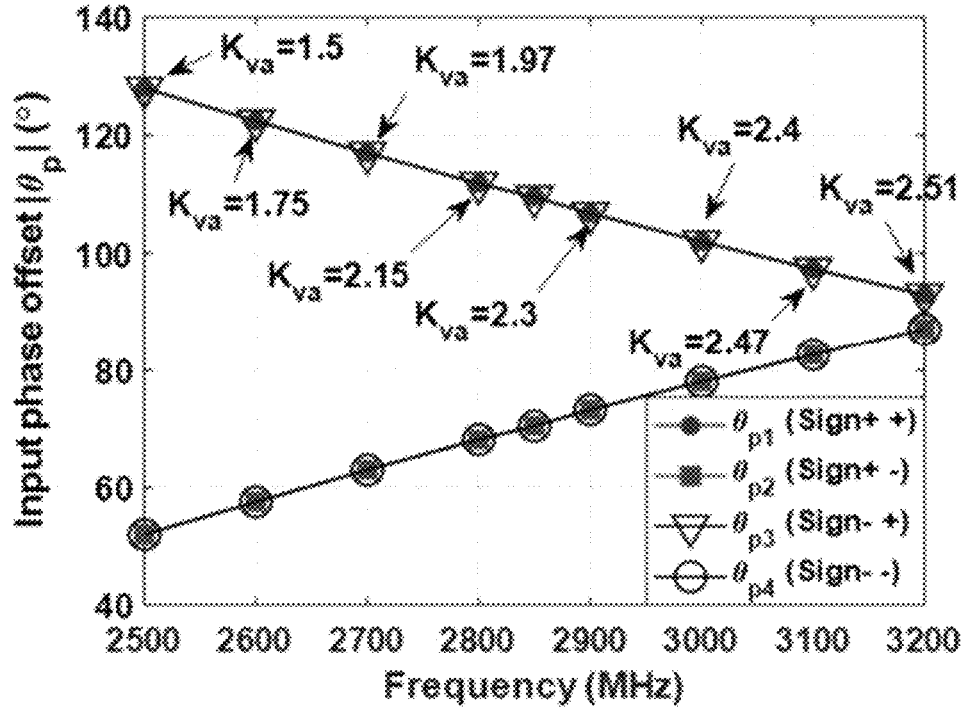
FIG. 3A is a graph 300 of theoretical outphasing angle $|\theta_p|$ versus frequency.
Figure 3B:
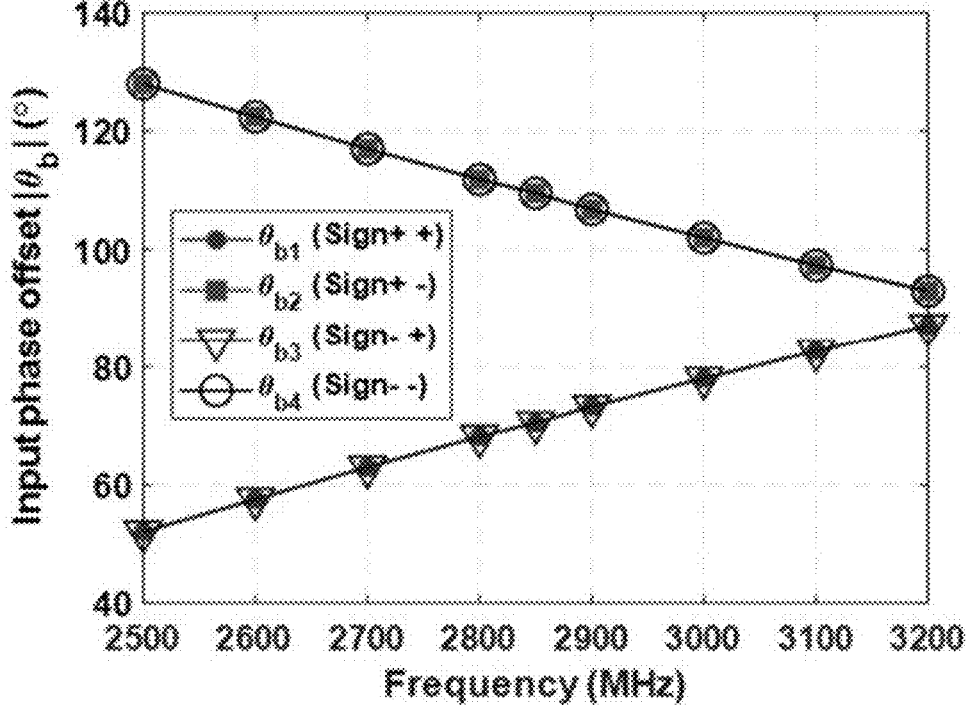
FIG. 3B is a graph 310 of theoretical outphasing angle $|\theta_b|$ versus frequency.
Figure 3C:
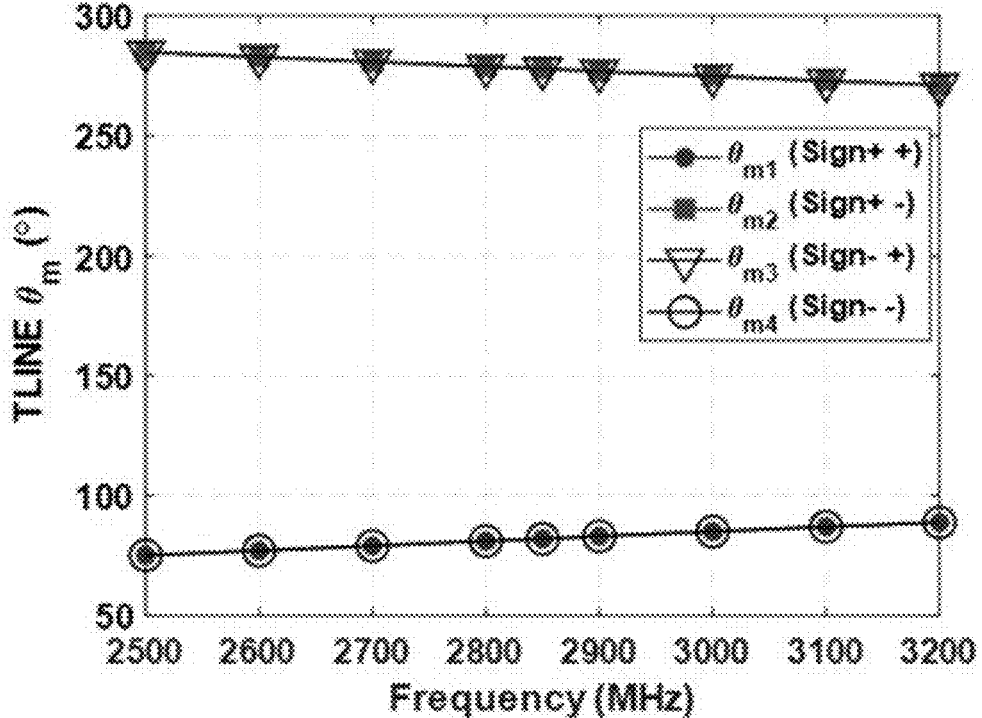
FIG. 3C is a graph 320 of theoretical electrical length $\theta_m$ versus frequency.
Figure 3D:
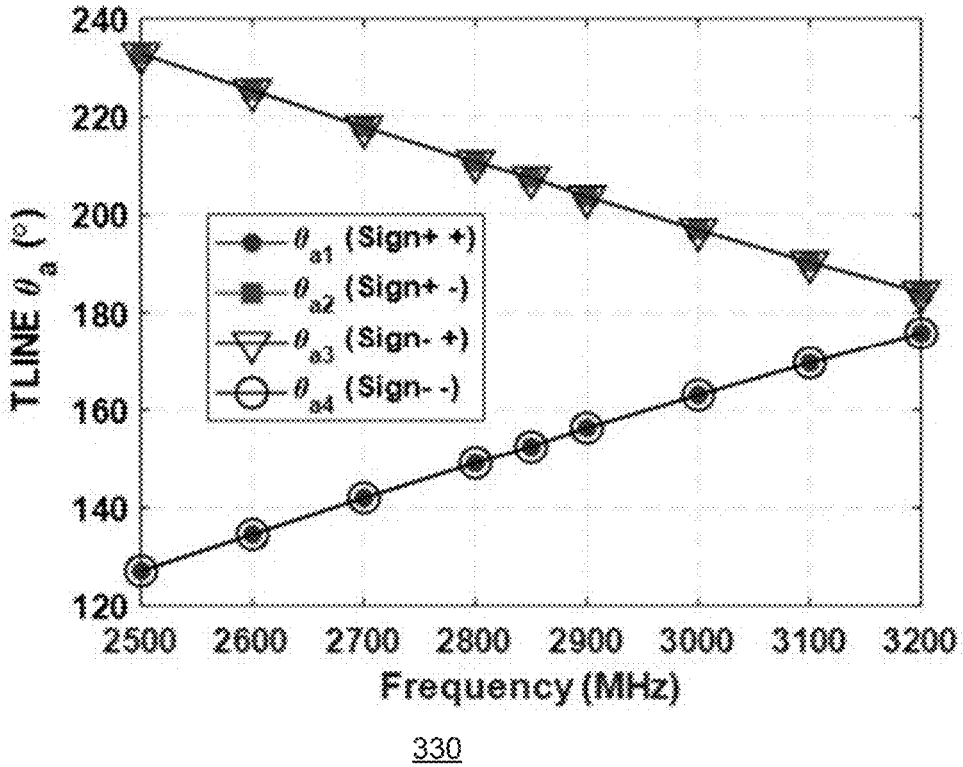
FIG. 3D is a graph 330 of theoretical electrical length $\theta_a$ versus frequency.

The four different cases based on different sign selection of equation (3) are plotted in FIGS. 3A-3D. The absolute values of $\theta_b$ and $\theta_p$ are shown in the graph 300 of FIG. 3A and the graph 310 of FIG. 3B, respectively. Based on equation (4) and equation (5), the electrical length for the main branch TL: $\theta_m$ and auxiliary branch TL: $\theta_a$ are also shown in the graph 320 of FIG. 3C and the graph 330 of FIG. 3D, respectively. The two positive signs ($\theta_{m1}$ and $\theta_{a1}$) or the two negative signs ($\theta_{m4}$ and $\theta_{a4}$) should be selected to reduce the physical length of the two TLs ($\theta_m$ and $\theta_a$). In summary, once the frequency dependence of $K_{va}(\omega)$ has been selected, the design of the HD$\omega$-PA output combiner prototype 200 shown in FIG. 2 is complete.

It is worth mentioning that for the operation of the dual input PAs, the outphasing angle $\theta$ needs to be varied gradually from $\theta_b$ to $\theta_p$ as the output power increases from backoff to peak power. However, to implement a single-input PA, the outphasing angle has to remain power-independent if it is to be realized with a passive input phase shifter circuit. The design of the input phase shifter will be discussed below. By sliding the value of $K_{va}$, one obtains a continuum of solutions for the HD$\omega$-PA output combiner, all maintaining the desired load modulation behavior from the Doherty PA mode to the HDmax PA mode. However, to design a single-input HD$\omega$-PA capable of operating across a wide range of frequencies, one needs to synthesize the frequency dependence of $K_{va}(\omega)$ such that the required HD$\omega$-PA output combiner is realizable while also maintaining a constant OBO. This is readily achieved if the combiner's TLs exhibit quasi-linear dispersion $\theta_m(\omega)$ and $\theta_a(\omega)$, as will be discussed further below.

Input Phase Shifter Design

Where the Doherty to HDmax continuum mode is selected, it further assumes that the auxiliary device is completely turned off below the backoff power level ($K_{ia}=\infty$), while the value of $K_{va}$ is sliding from the Doherty to HDmax PA modes. Hence, only the main device is actively operating below the backoff power. Thereby, the outphasing angle value at backoff has an insignificant impact on the PA's overall backoff efficiency since the main amplifier, which is typically biased at class-B/AB mode, is dominating the PA performance at backoff. It is then reasonable to keep the input outphasing angle θ constant between peak and backoff to realize the desired single-input PA at each frequency. As the electrical length of the main and auxiliary TLs has been determined in the previously, from FIGS. 3A and 3B there are eight candidates for the outphasing angles remaining to be selected as the input phase offset: $\theta_{bi}$ and $\theta_{pi}$. To reduce the physical length of the input phase shifter, $\theta_{b1}$, $\theta_{b3}$, $\theta_{p2}$, or $\theta_{p4}$ should be selected due to their smaller electrical length value. It was discussed previously that either the solution $\theta_{b1}$ or $\theta_{p4}$ must be selected to reduce the physical length of the output combiner. Thus, to jointly reduce the physical length of both the phase shifter and the output combiner, the input phase offset $\theta(\omega)$ must be selected to be either $\theta_{b1}(\omega)$ or $\theta_{p4}(\omega)$ It has been found that the choice of $\theta_{b1}$ or $\theta_{p4}$ also has an impact on the variation in the saturation power $P_{sat}$ versus frequency. The Z-parameters of the HDω-PA output combiner may be simplified to be:

$$Z = \begin{bmatrix} R_{mb} & \dfrac{R_{ap}(OBO-1)}{K_{va}+1}e^{-j\theta_b} \\ \dfrac{R_{ap}(OBO-1)}{K_{va}+1}e^{-j\theta_b} & R_{ap}\beta \end{bmatrix} \quad (9)$$

with $$\beta = \dfrac{1 + \dfrac{OBO+K_{va}}{K_{va}(K_{va}+1)} + \dfrac{K_{va}^2 - OBO}{K_{va}(K_{va}+1)} \cdot j\tan\theta_b}{1 + j\tan\theta_b}$$

The fundamental current defined as flowing out of the main PA is set as $I_m = |I_m|$, and the fundamental current defined as flowing out of the auxiliary PA is set as $I_a = |I_a|e^{-j\theta}$, where θ refers to the input phase offset angle between the main and auxiliary PAs. It is noted that $I_m$ and $I_a$ are both power- and frequency-dependent; however, θ is set to be only frequencydependent. The fundamental voltages for the main PA $V_m$ and for the auxiliary PA $V_a$ are calculated by:

$$V_m(K_{va}, \theta) = Z_{11} \cdot I_m + Z_{12} \cdot I_a$$

$$V_a(K_{va}, \theta) = Z_{12} \cdot I_m + Z_{22} \cdot I_a.$$

The load-modulated impedance seen by the main and auxiliary devices and output power delivered by the HDω-PA output combiner are given by:

$$Z_{mL}(K_{va}, \theta) = \dfrac{V_m}{I_m}; Z_{aL}(K_{va}, \theta) = \dfrac{V_a}{I_a} \quad (10)$$

$$P_{out}(K_{va}, \theta) = \dfrac{1}{2}Re\{V_m I_m^*\} + \dfrac{1}{2}Re\{V_a I_a^*\}$$

To observe the impact on the saturation power and load impedance caused by the input phase offset angle θ, a theoretical analysis is performed to visualize the variation in $P_{out}$. The drain bias $V_{DD}$ is set to be 25 V and $I_{max}$ at 1.8 A across all the frequencies. Assuming the device knee voltage is $V_k$=3 V, the fundamental voltage at peak power for the main and auxiliary PAs is $|V_{mp}|=|V_{ap}|=V_{DD}-V_k$=22 V. By sweeping $K_{va}$ from 1.5 to 2.5, the variation in the saturation power $\Delta P_{sat}$ is calculated, where $\Delta P_{sat}$ is defined as:

$$\Delta P_{sat} = |P_{sat}(K_{va}) - \min(P_{sat}(K_{va}))| \quad (11)$$

Figure 4:
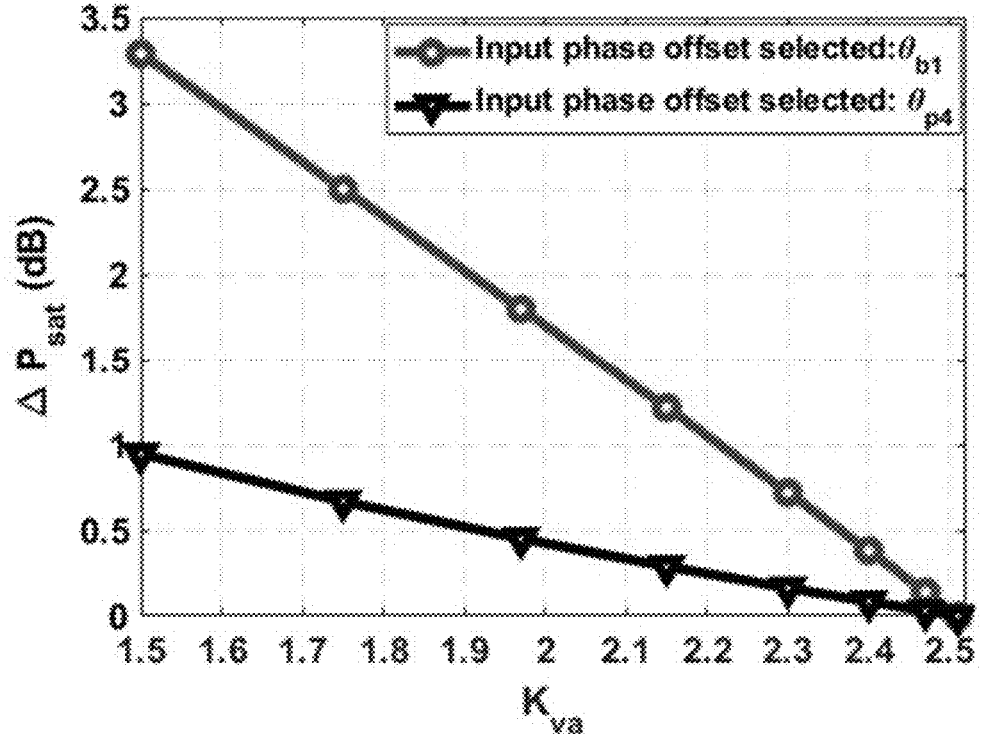
FIG. 4 is a graph 400 of a theoretical analysis on the saturation power variation by selecting different input outphasing angles: $\theta_{p4}(\omega)$ and $\theta_{b1}(\omega)$.

As shown in FIG. 4, the circles and triangles indicate the variation in the saturation power $\Delta P_{sat}$ versus $K_{va}$ when the input phase offset angle $\theta_{b1}$ or $\theta_{p4}$ is used, respectively. This shows that $\Delta P_{sat}$ is smaller versus $K_{va}$ (frequency) when $\theta_{p4}$ is adopted.

To further demonstrate which outphasing angles—$\theta_{b1}$ or $\theta_{p4}$—should be selected as the constant input phase offset angle for optimal performance, three circuit harmonic balance simulations using advanced design system (ADS) are performed based on the circuits topology shown in the circuit 200 of FIG. 2. The resulting simulated load modulation trajectories and power-added efficiency (PAE) for the three cases are plotted in the graphs 510, 520, 530, 540, 550, and 560 of FIGS. 5A-5F.

For case I, where the outphasing angle θ is fixed at $\theta_{p4}$ as the input power is increased, the saturation power level and the efficiency are similar to each other when sweeping $K_{va}$ from 1.5 to 2.5. This agrees with the theoretical analysis performed in FIG. 4. However, for case II where the input phase is selected to be $\theta_{b1}$, the saturation power is around 4 dB less for $K_{va}$=1.5 compared with the saturation power for $K_{va}$=2.5, as expected from the theoretical analysis as shown in the graph 400 of FIG. 4.

Figure 5A:
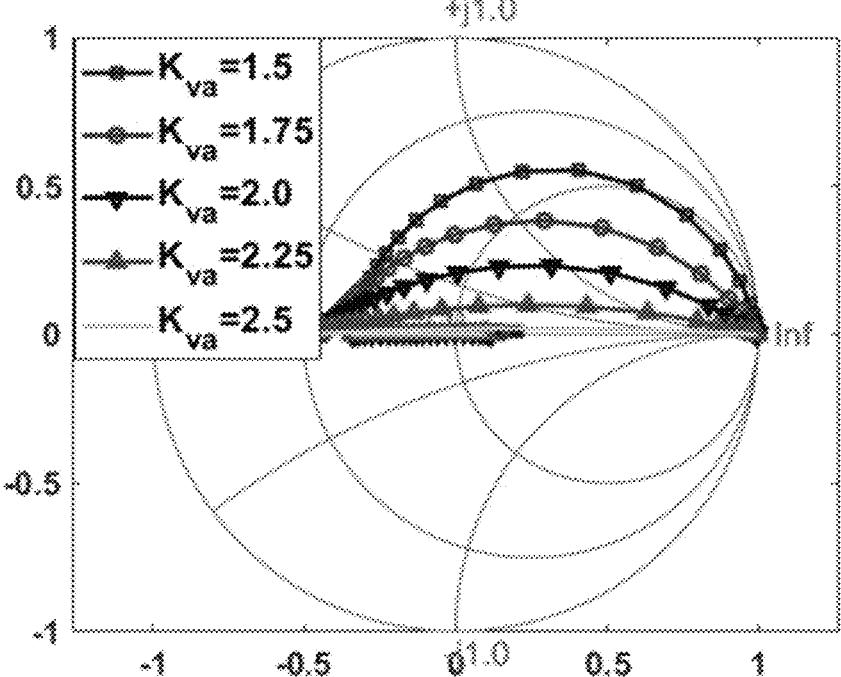
FIGS. 5A-5F are graphs 510, 520, 530, 540, 550, and 560 of simulated load modulation trajectories and PAE versus $K_{va}$ based on the ADS schematic depicted in FIG. 2.
Figure 5B:
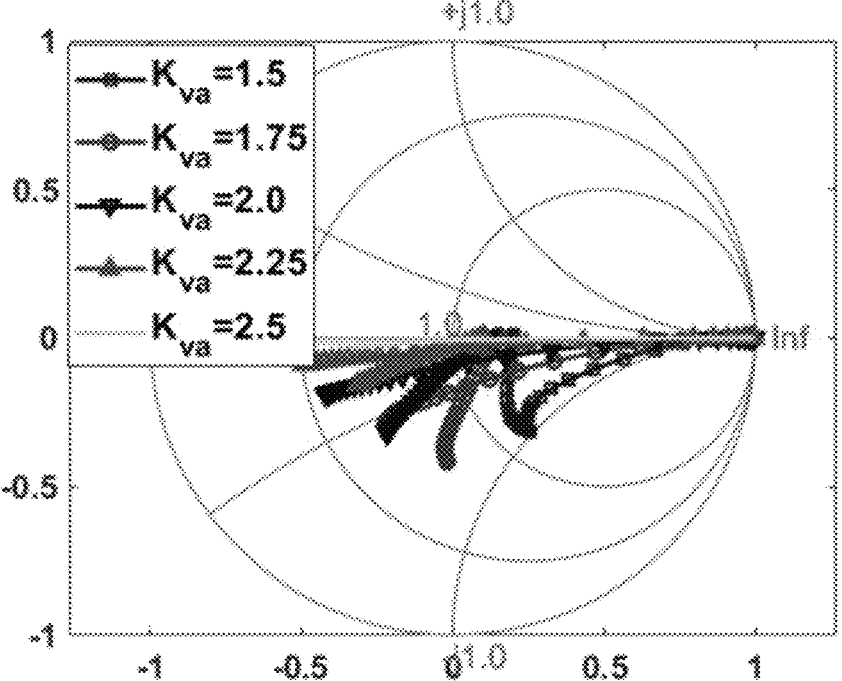
Figure 5C:
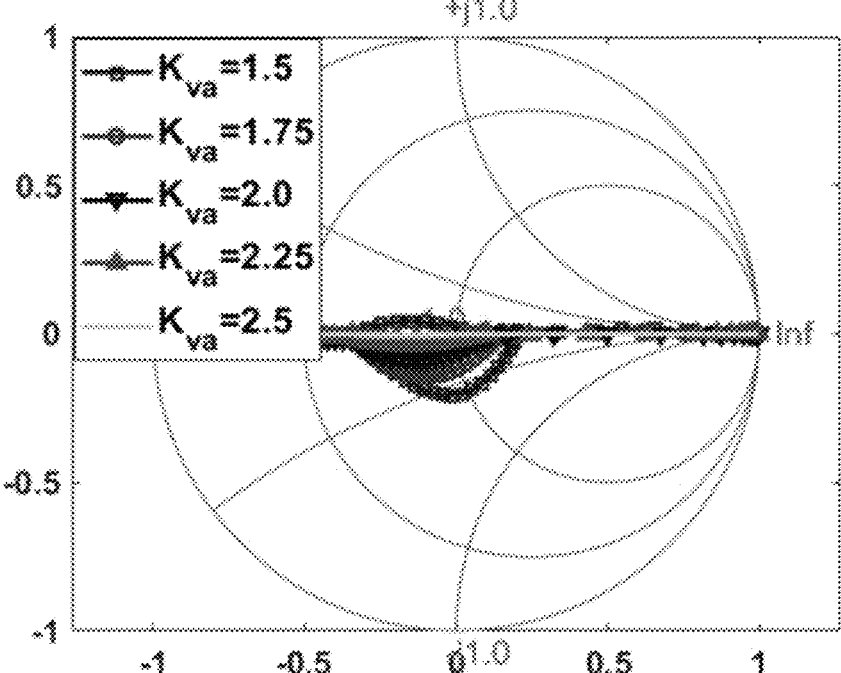
Figure 5D:
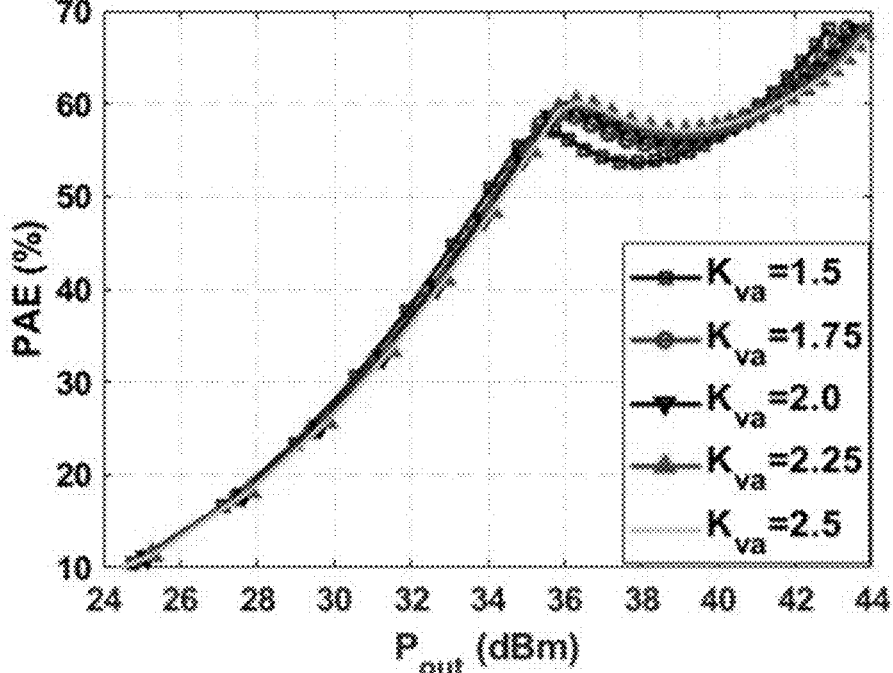
Figure 5E:
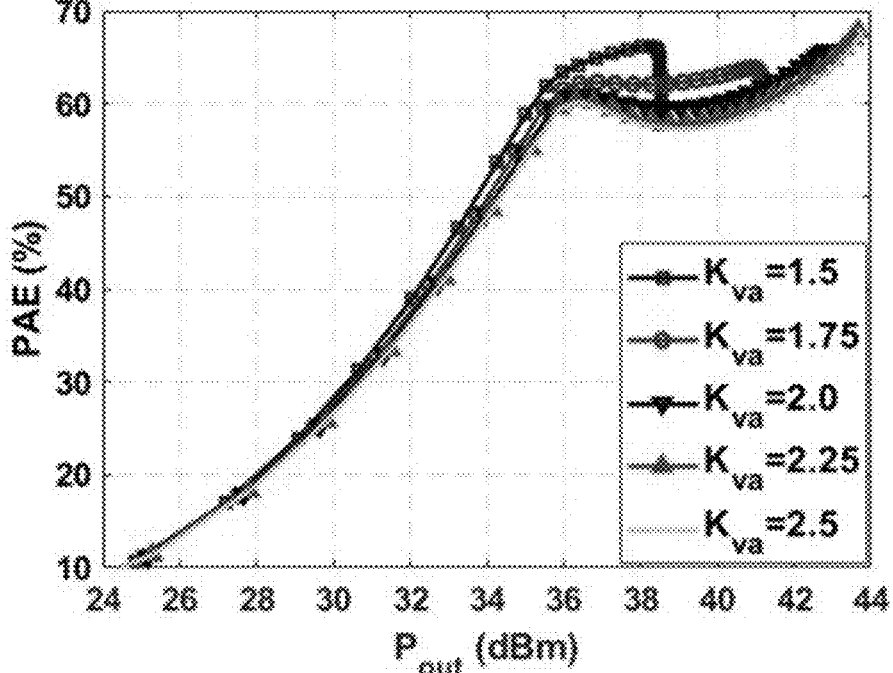
Figure 5F:
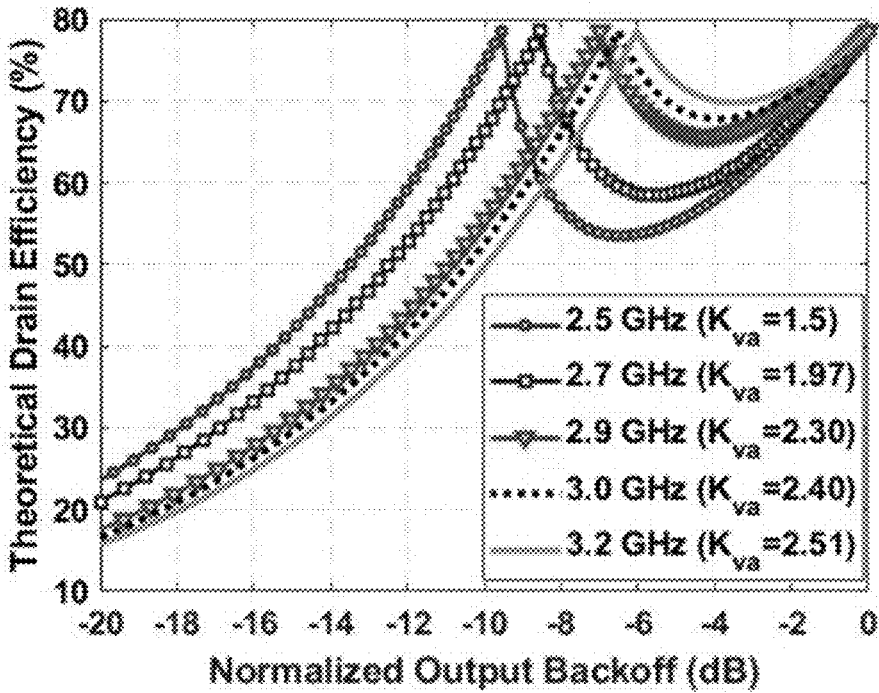

Intuitively, the saturation power loss is due to the improper load modulation behavior as shown in the graph 520 of FIG. 5B when the input phase offset $\theta=\theta_{b4}$ deviates from $\theta_a(\omega)-\theta_m(\omega)$. Case III shown in the graphs 550 and 560 of FIGS. 5E and 5F, respectively is used as a reference, where the outphasing angle is varied linearly from $\theta_{b1}$ to $\theta_{p4}$ as the incident power increases under each $K_{va}$ value. Although there is a minor efficiency degradation in case I between the backoff and peak power regimes compared with the performance achieved by the reference dual-input PA prototype in case III, the backoff efficiencies and saturation powers obtained are similar in both the cases. Therefore, to design a wideband single-input PA with relatively constant saturation power, the input phase offset $\theta(\omega)$ should be selected to be equal to $\theta_{p4}(\omega)$ in equation 3. It is also worth mentioning that fine-tuning around $\theta_{p4}(\omega)$ could be performed to further minimize the saturation power variation versus frequency when the physical circuit is being implemented.

Table I below summarizes the targeted HDω-PA design parameters predicted by the theory, which are used to guide the PA circuit design and optimization.

TABLE 1

| $f_0$ | 2.5 GHz | 2.6 GHz | 2.7 GHz | 2.8 GHz | 2.9 GHz | 3.0 GHz | 3.1 GHz | 3.2 GHz |
|---|---|---|---|---|---|---|---|---|
| $K_{va}\,(\omega)$ | 1.50 | 1.75 | 1.97 | 2.15 | 2.30 | 2.40 | 2.47 | 2.51 |
| $\theta\,(\omega)$ | 52.0° | 57.5° | 63.0° | 68.2° | 73.2° | 78.0° | 82.7° | 87.0° |
| $R_{mp}$ | 24.4Ω | 24.4Ω | 24.4Ω | 24.4Ω | 24.4Ω | 24.4Ω | 24.4Ω | 24.4Ω |
| $R_{mb}\,(\omega)$ | 76.3Ω | 71.6Ω | 68.1Ω | 65.6Ω | 63.8Ω | 62.6Ω | 61.8Ω | 61.5Ω |
| $R_{ap}\,(\omega)$ | 23.9Ω | 21.2Ω | 19.3Ω | 18.1Ω | 17.3Ω | 16.7Ω | 16.4Ω | 16.2Ω |
| $Z_m$ | 24.4Ω | 24.4Ω | 24.4Ω | 24.4Ω | 24.4Ω | 24.4Ω | 24.4Ω | 24.4Ω |
| $Z_a\,(\omega)$ | 23.9Ω | 21.2Ω | 19.3Ω | 18.1Ω | 17.3Ω | 16.7Ω | 16.4Ω | 16.2Ω |
| $R_L\,(\omega)$ | 12.1Ω | 11.4Ω | 10.8Ω | 10.4Ω | 10.1Ω | 9.9Ω | 9.8Ω | 9.7Ω |
| $\theta_m\,(\omega)$ | 75.1° | 77.0° | 79.0° | 80.5° | 83.0° | 85.3° | 87.3° | 88.8° |
| $\theta_a\,(\omega)$ | 127.1° | 134.6° | 142.8° | 149.2° | 156.3° | 163° | 169.6° | 175.8° |

Comparison of the PA Theoretical Performance

The case where OBO is fixed at 8 dB versus frequency has been investigated. However, it is also possible to convert a wideband dual-input PA for constant saturated power $P_{sat}$ into a single-input PA using different input phase shifter and output combiner designs. By setting n=1 in equation (1), the saturation power remains constant with results that OBO is given by: OBO=2$K_{va}$1($K_{va}$−1). A similar quadratic equation for $K_{va}$ in terms of $\theta_m(\omega)$ can also be formulated as, for the case of n=1:

$$\left(1 + \tan^2\theta_m\right)K_{va}^2 + \left(1 - 3\tan^2\theta_m\right)K_{va} + 2\tan\theta_m^2 = 0.$$

Similar to the equation (7), $K_{va}$ can be calculated by taking the ratio of tan $\theta_m$ and tan $\theta_a$ given by equation (6) where the main TL electrical length $\theta_m(\omega)$ is the user-defined linear dispersion given by equation (6). After solving the $K_{va}$ quadratic equation, the auxiliary TL electrical length tan $\theta_a(\omega)$ is given by:

$$\tan\theta_a(\omega) = \tan\theta_m(\omega)\frac{K_{va}(\omega) - 2}{K_{va}(\omega)}. \tag{12}$$

The theoretical drain efficiency η versus the normalized backoff power can then be calculated for different $K_{va}(\omega)$. By assuming ideal class-B operation for both the main and auxiliary PAs, the drain efficiencies η are given by:

$$\eta(K_{va}, P_{out}) = \frac{P_{out}}{P_{dc}} = \frac{\pi\{Re\{V_m I_m^*\} + Re\{V_a I_a^*\}\}}{4V_{DD}(|I_m| + |I_a|)}. \tag{13}$$

Figure 6A:
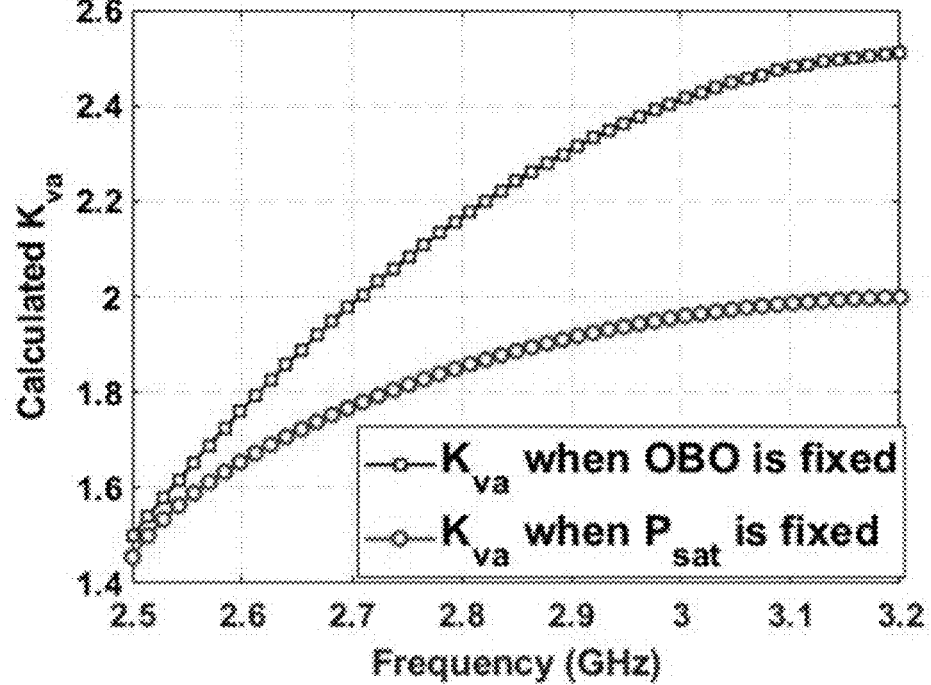
FIGS. 6A-6F are graphs 610, 620, 630, 640, 650, and 660 of theoretical analyses comparing constant OBO and constant saturated power (constant n) designs.
Figure 6B:
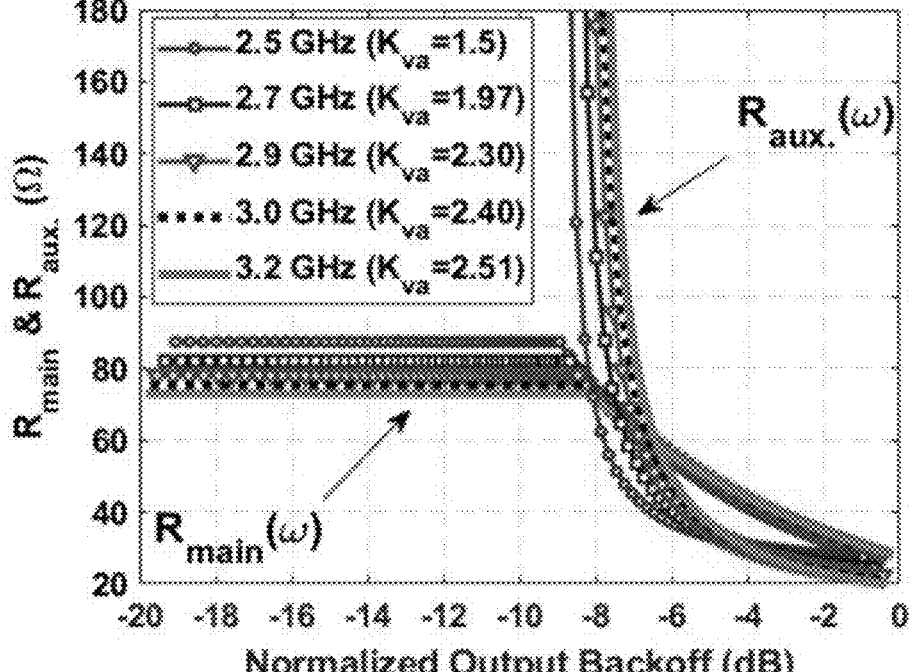

In some embodiments, Case I is for OBO fixed at 8 dB for all the frequencies. To demonstrate several input designs are possible, we shall compare Case I with Case II where the asymmetry power ratio n is fixed at 1 (constant saturated power) for all the frequencies. To compare the theoretical performance between the two cases, $K_{va}$ and theoretical electrical length $\theta_a$ are plotted in the graph 610 of FIG. 6A and the graph 620 of FIG. 6B, respectively. It is noted that the calculated frequency dispersion of $\theta_a$ for Case I is less nonlinear than that for Case II, which makes it easier for implementing with the TL-based output matching circuits.

Figure 6C:
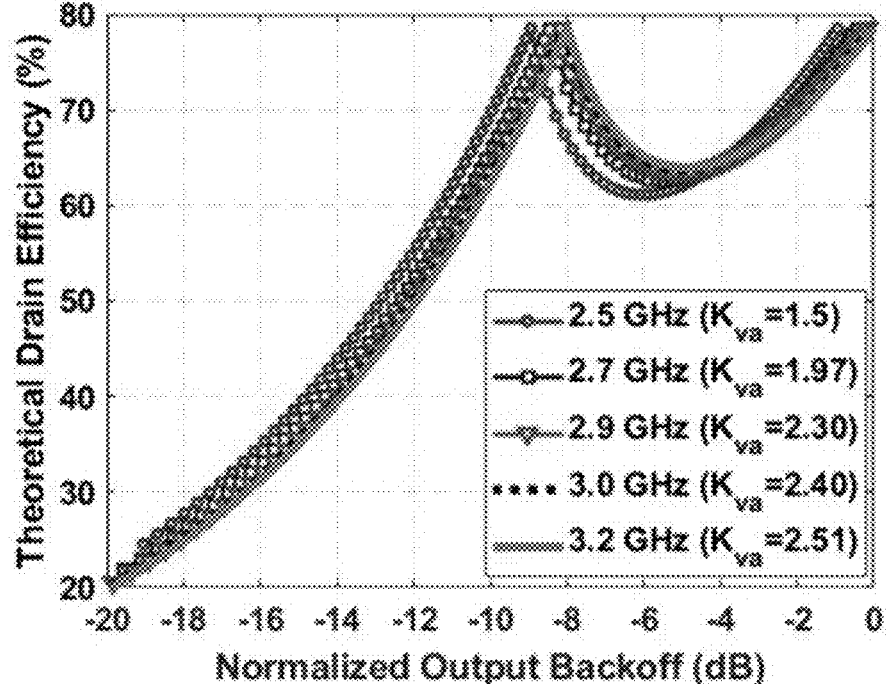
Figure 6D:
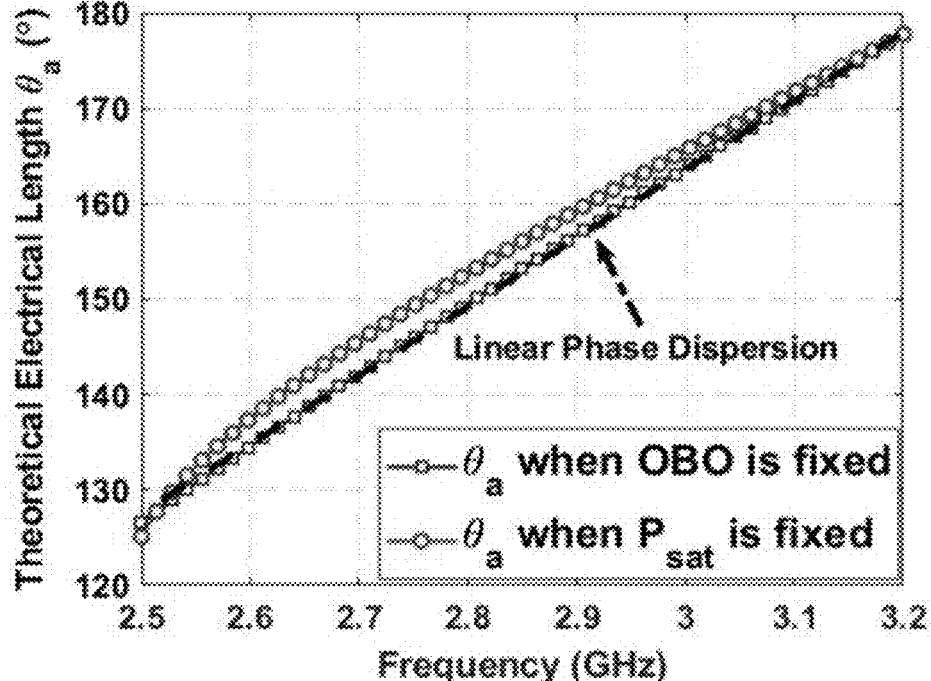
Figure 6E:
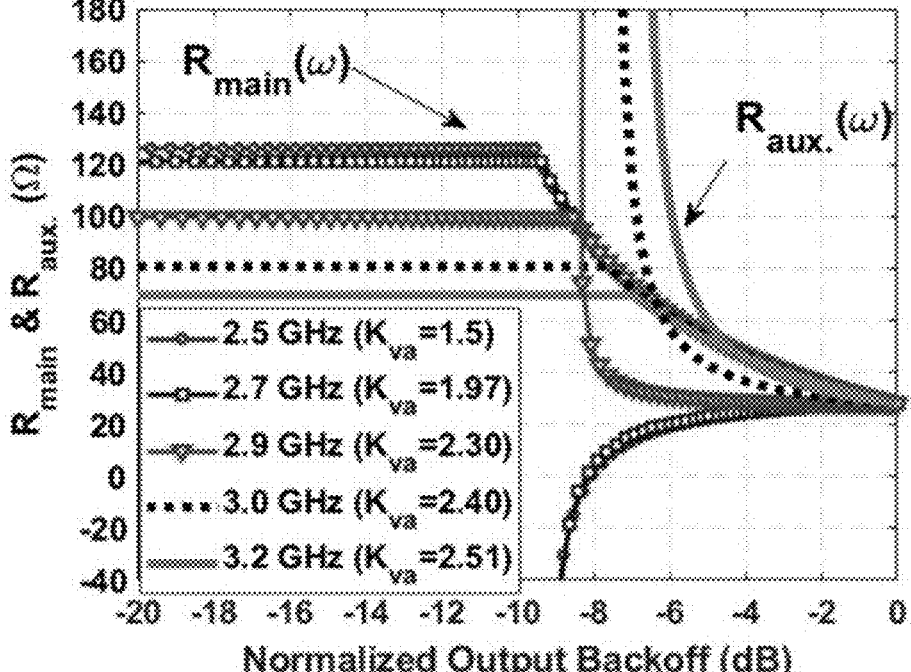
Figure 6F:
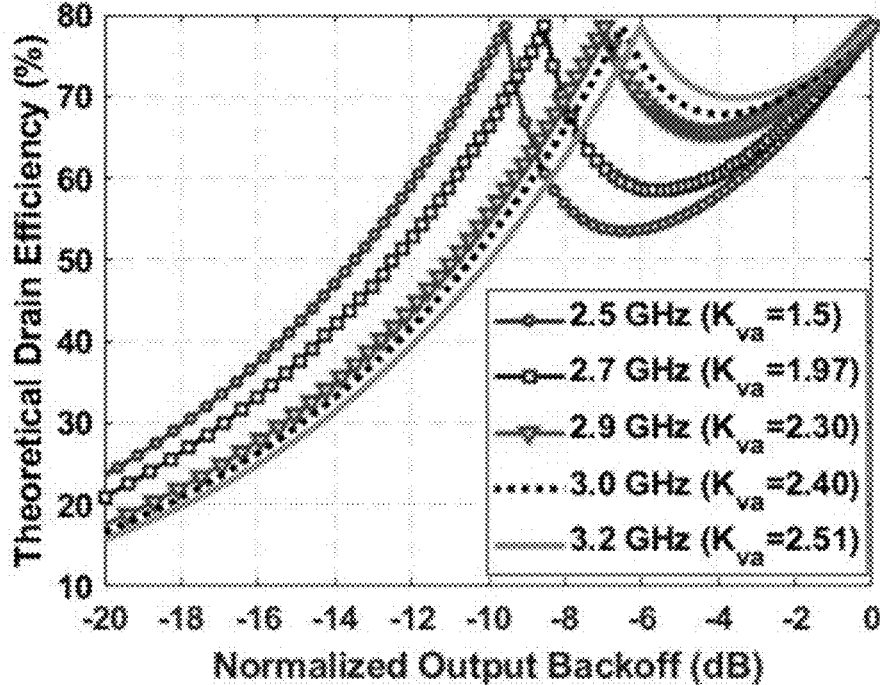

The theoretical load-modulated impedances seen by the main and auxiliary devices for both the cases are shown in the graph 620 of FIG. B and the graph 650 of FIG. 6E, respectively. The backoff impedance variation versus frequency of Case I is significantly smaller than that of Case II, which also facilitates the wideband impedance matching process in the final design realization. To better visualize the performance distinction between the two cases, the efficiency response versus power and frequency under both the cases are plotted in the graph 630 of FIG. 6C and the graph 660 of FIG. 6F, respectively. Although Case II exhibits a constant saturation power in theory, the OBO varies by more than 3 dB as the frequency increases. Case I with fixed OBO design is adopted for a single-input wideband. PA design in this work, due to its more linear frequency dispersion of the electrical length and more closely grouped backoff impedances versus frequency.

PA Circuits Design

Figure 7A:
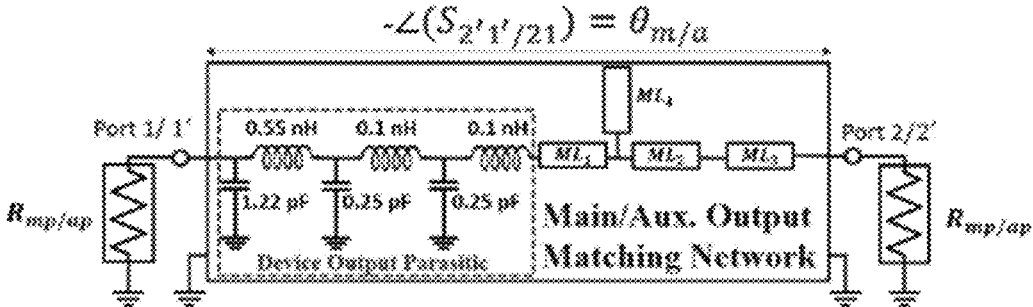
FIG. 7A is an illustration of a synthesis 710 of the effective overall electrical lengths of the main/auxiliary branches and the effective characteristic impedances of the main/auxiliary branches.

To validate the proposed theory, a wideband HDω-PA demonstrator circuit operating from 2.5 to 3.2 GHz is designed and evaluated. The main and auxiliary PA branches are first designed and optimized using multisection TLs and open stub circuits as shown in the circuit 710 of FIG. 7A. It is noted that the multisection TLs need to be optimized to simultaneously satisfy the targeted electrical dispersion and load impedance transformation from 2.5 to 3.2 GHz, while controlling the second-harmonic impedance to avoid the PAE minimum region. At peak power level, the impedances $$R'_{mp} \text{ and } R'_{ap}$$

seen at the combiners junction point shown in the circuit 100 of FIG. 1 need to be transformed for all the frequencies to $R_{mp}$ and $R_{ap}$ seen by the main and auxiliary PAs, respectively. The target design goals for the impedance and electrical length versus frequency are summarized in Table I. It is noted in Table I that at peak power level, we have $$R'_{mp} = R_{mp} \text{ and } R'_{ap} = R_{ap}$$

across the entire band. The optimized main and auxiliary PA branches provide the impedance transformation from 2.5 to 3.2 GHz presented in the zoomed-in Smith chart shown in the graph 810 FIG. 8A. The solid line refers to the simulated $R_{ap}$ across the frequency and the dot refers to the theoretical $R_{ap}$=24.4Ω. The dashed line refers to the simulated $R_{mp}$ across the frequency, which are carefully optimized to track the targeted $R_{mp}$ trajectory depicted by the rectangles.

Using the frequency-dependent $K_{va}(\omega)$ determined in equation (7), $\theta_m(\omega)$ and $\theta_a(\omega)$ dispersion results are shown in the graph 820 of FIG. 8B from 2.5 to 3.2 GHz. It is worth mentioning that the frequency dependence of $K_{va}(\omega)$ (indicted by solid dots and rectangles) establishes a quasi-linear phase response versus frequency approaching that of an ideal TL dispersion (indicated by the dash-dotted and dashed lines), which greatly facilitates the combiner design outlined next. The linear parasitic L-C model of a GaN device is incorporated in the design to move the design from the package to the current source reference planes. Alternatively, instead of performing the circuits' design and optimization shown in the circuits 710 and 720 of FIGS. 7A and 7B, the main and auxiliary PA output branches can be modeled as a network of lossy TLs with equivalent characteristic impedance $Z_0$ and electrical length $\phi$.

Figure 7B:
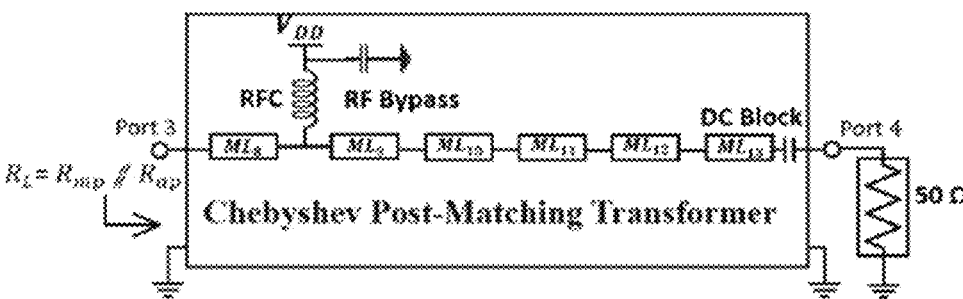
FIG. 7B is an illustration of an output postmatching transformer 720.
Figure 8C:
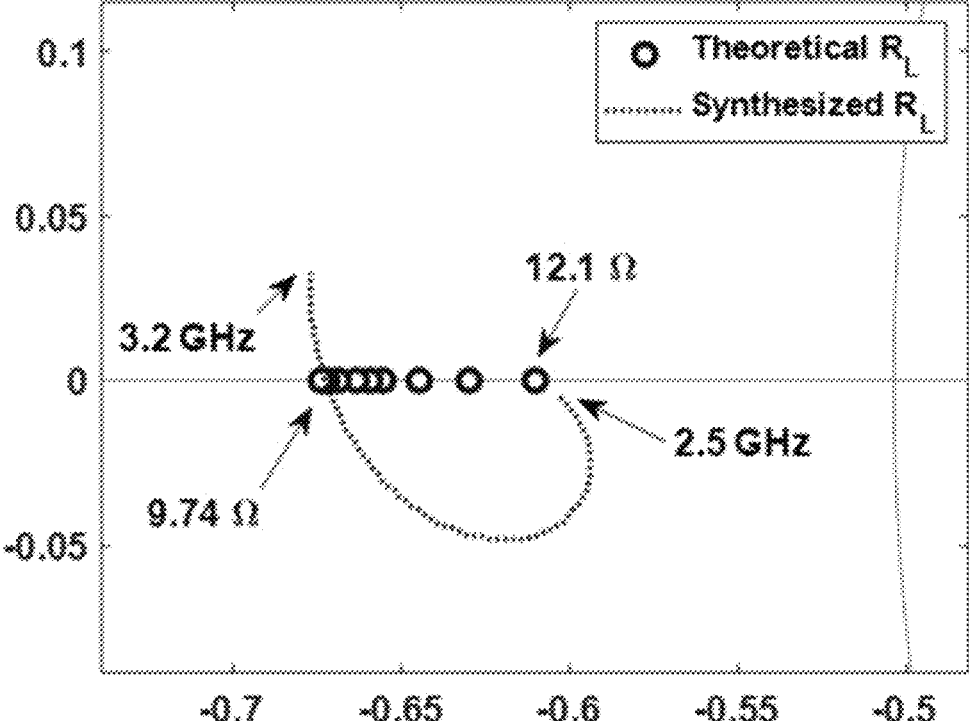
FIG. 8C is a graph 830 of synthesized $R_L$ on the zoomed-in Smith chart.
Figure 9:
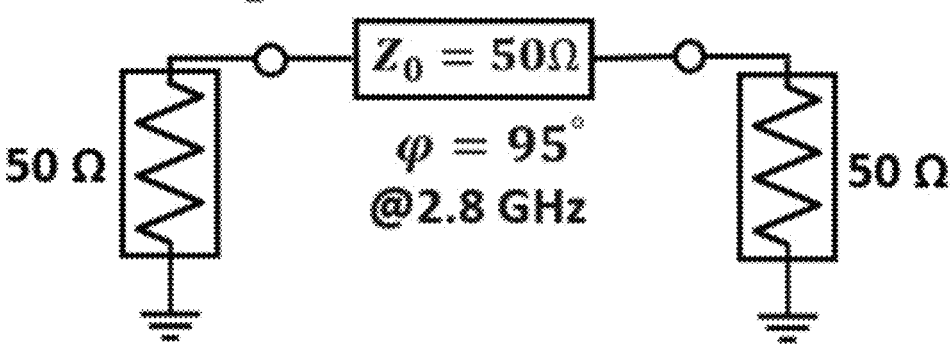
FIG. 9 is an illustration of an example TL-based phase shifter 900.
Figure 10:
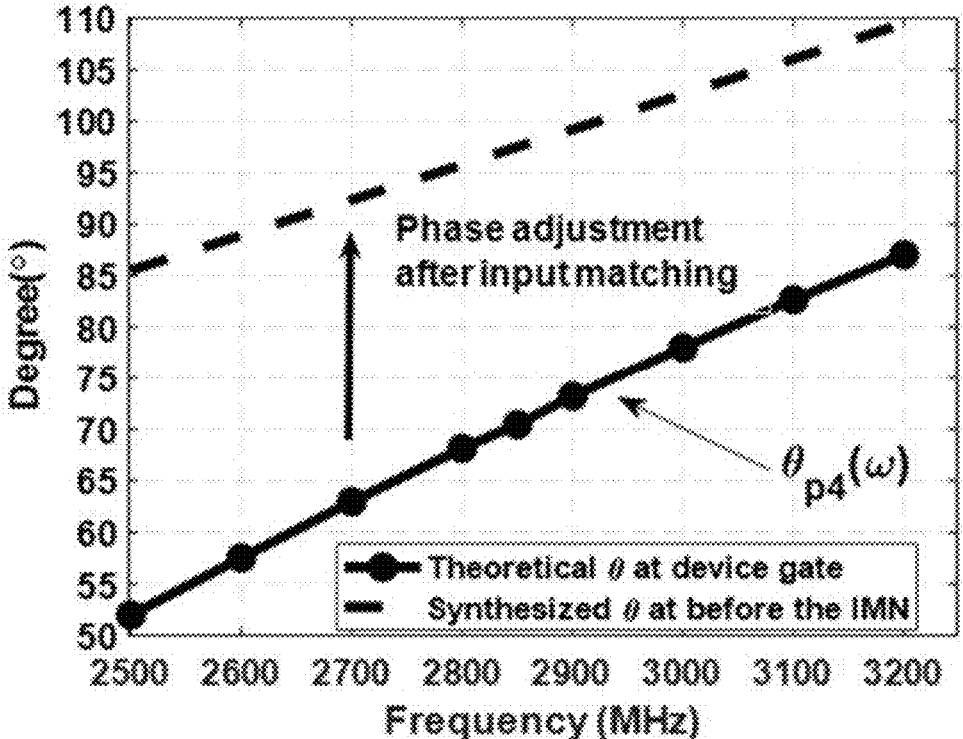
FIG. 10 is a graph 1000 of simulated input phase offset angles versus frequency.

A Chebyshev post-matching transformer and the drain bias circuits 720 as shown in FIG. 7B are co-designed to transform the output 50-Ω load to $R_L$ summarized in Table I across the entire frequency band. The simulated frequency-dependent $R_L$ is indicated by the dash trajectory in the zoomed-in Smith chart of the graph 830 in FIG. 8C, which are closely tracking the targeted design goals (blue hollow circle). A parallel R-C network (2 pF//50Ω) is used to stabilize the PA. A low-Q broadband input matching circuit 900 is then implemented to transform the device's gate input impedance to approximately 50Ω from 2.5 to 3.2 GHz. A 50-Ω TL as shown in FIG. 9 is used as the PA input phase shifter 120 to match the required theoretical frequency-dependent input phase offset $\theta_{p4}$ shown in the graph 1000 FIG. 10.

Figure 11:
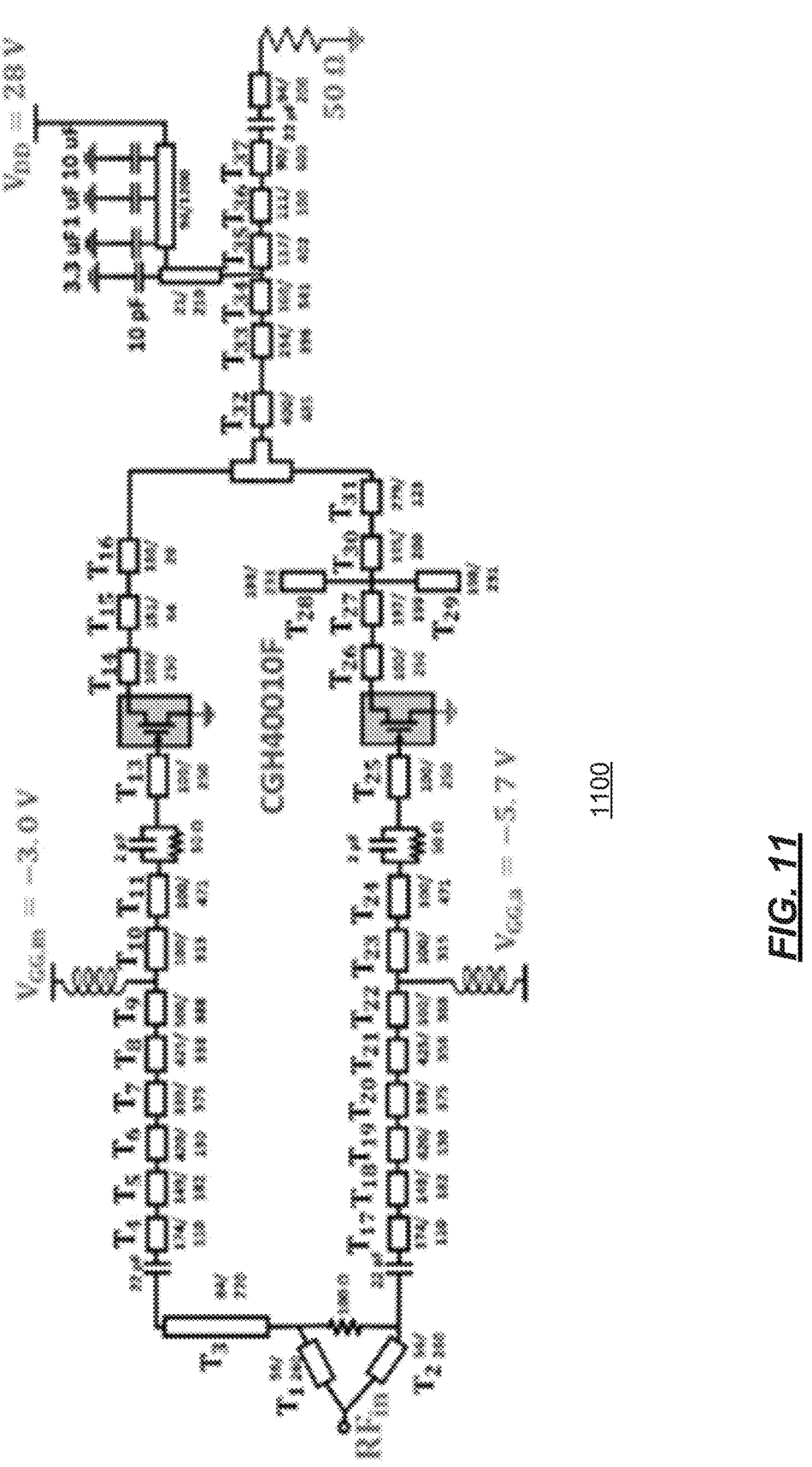
FIG. 11 is an illustration of a schematic 1100 of the proposed HD$\omega$-PA (unit: mils)
Figure 12:
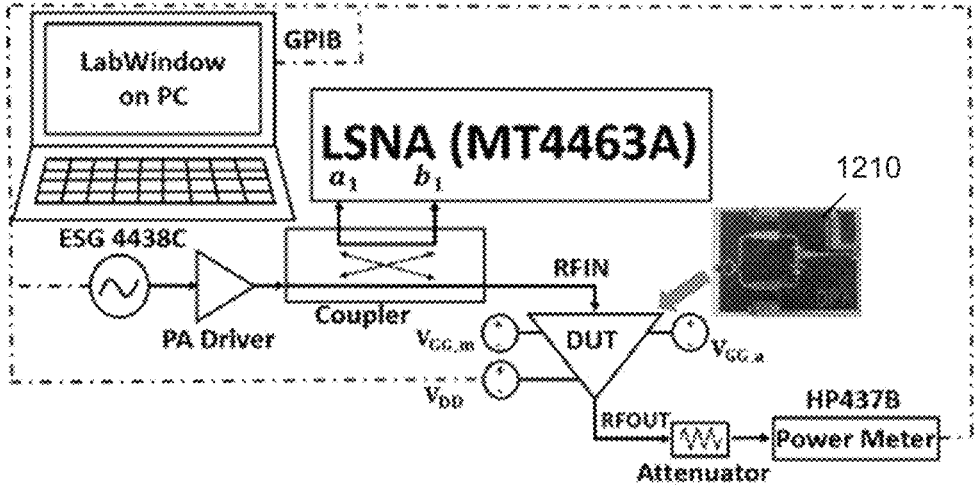
FIG. 12 is an illustration of a fabricated wideband dual-input HD $\omega$-PA demonstrator circuit 1210 in an LSNA test bench 1200 used for CW measurements.

It is noted that the theoretical input phase offset (marked with dots) is different from the final determined phase angles (marked by the dashed lines) due to the nonlinear embedding and linear embedding process introduced by the input matching network. A symmetric Wilkinson power divider is used to split the incident power evenly from 2.5 to 3.2 GHz. The simplified schematic of the proposed wideband HDω-PA is shown in the circuit 1100 of FIG. 11. The final fabricated HDω-PA circuit 1210 and the large signal network analyzer (LSNA) PA testbench are shown in the circuit 1200 FIG. 12. This PA was built on a Rogers IsoClad 917 substrate with a relative dielectric constant of 2.2 and a thickness of 31 mil. Two Wolfspeed's gallium nitride (GaN) high-electron-mobility transistors (HEMTs) CGH40010F are used for both the main and auxiliary PAs. The gate bias voltage for the main PA is −3.0 V with a dc quiescent current of 55 mA. The gate bias voltage for the auxiliary PA is set to be −5.7 V. The main and auxiliary PAs share the same dc drain bias of 28 V.

Simulation and Measurement Results

Figure 13A:
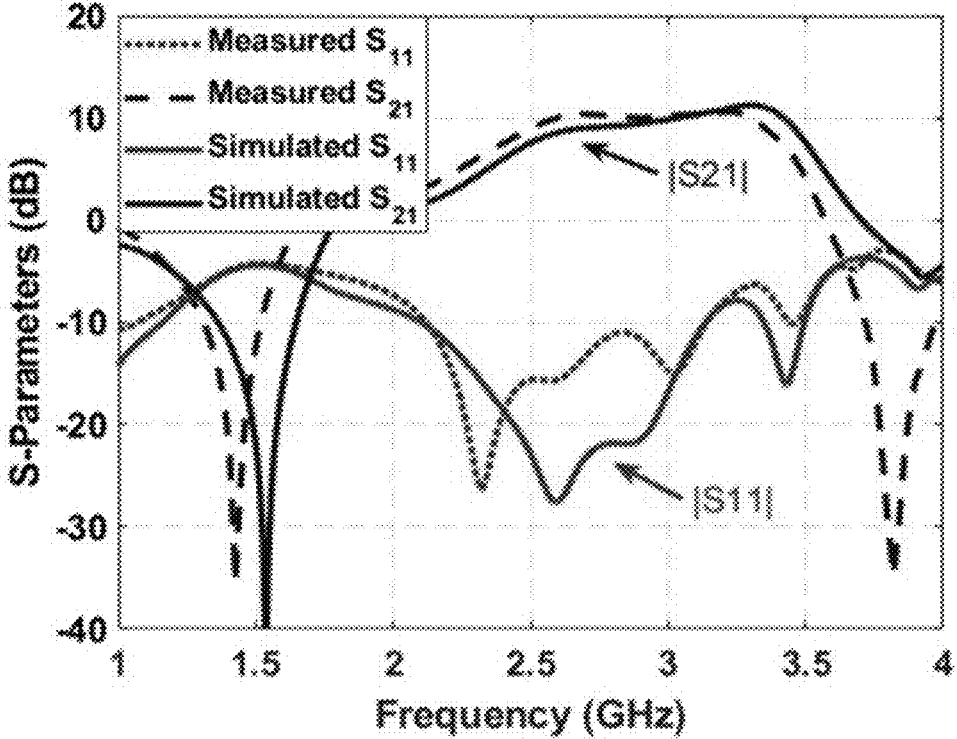
FIG. 13A is a graph 1310 of simulated versus measured small-signal performance $|S_{11}|$ and $|S_{21}|$.
Figure 13B:
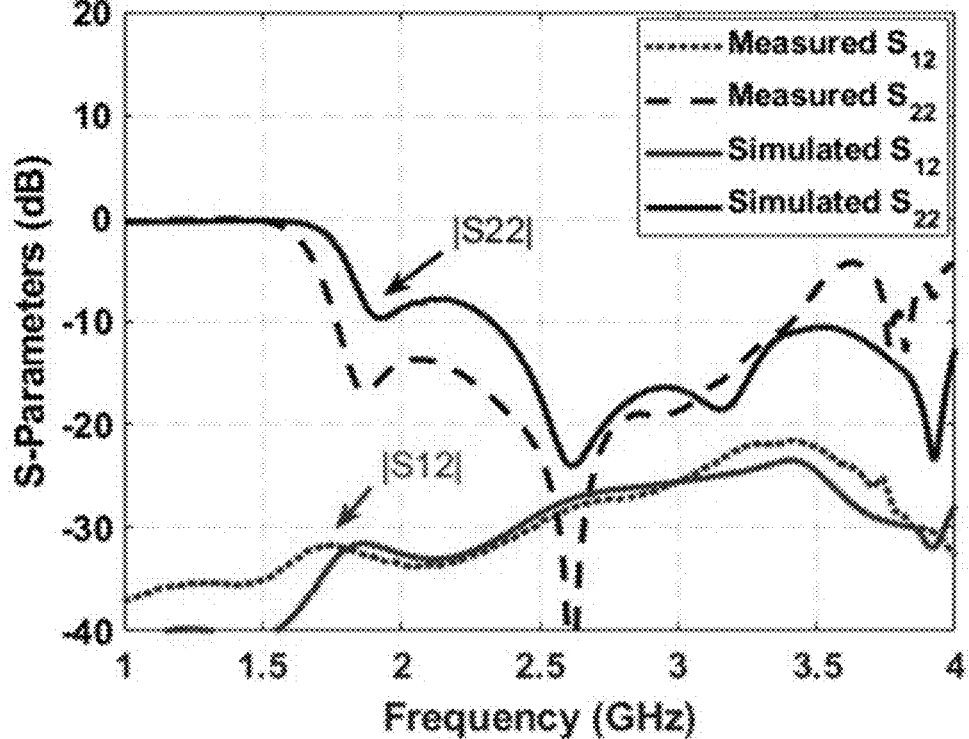
FIG. 13B is a graph 1320 of simulated versus measured small-signal performance $|S_{12}|$ and $|S_{22}|$.
Figure 14A:
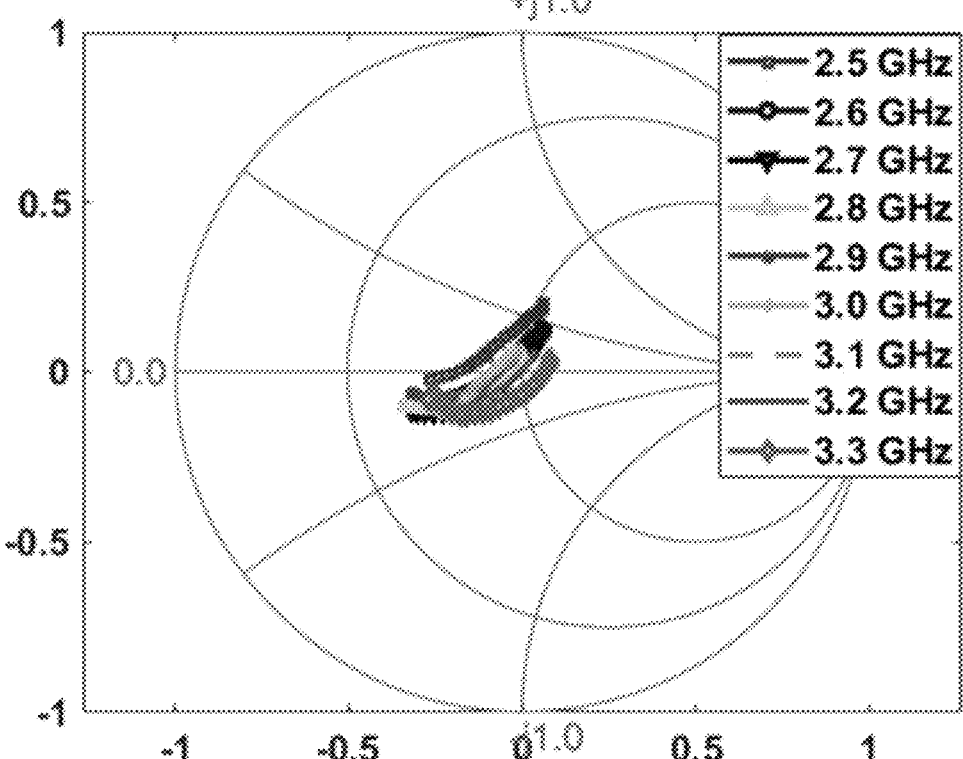
FIG. 14A is a graph 1410 simulated load trajectories versus frequency seen by the main PA.
Figure 14B:
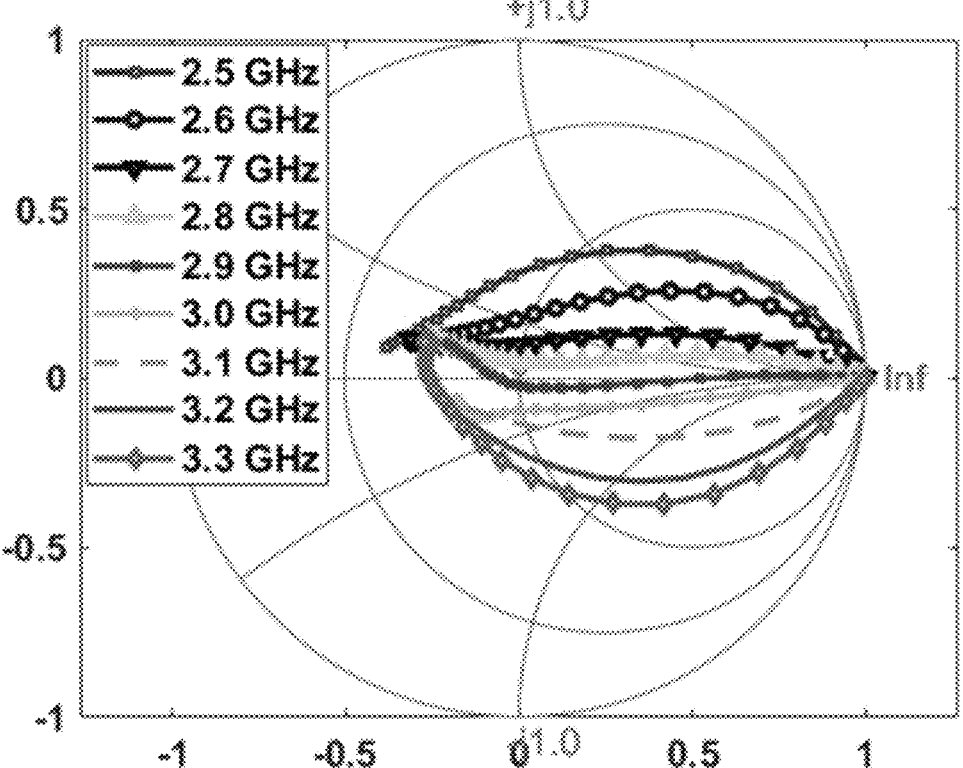
FIG. 14B is a graph 1420 of simulated load trajectories versus frequency seen by the simulated load trajectories versus frequency seen by the auxiliary PA.
Figure 15A:
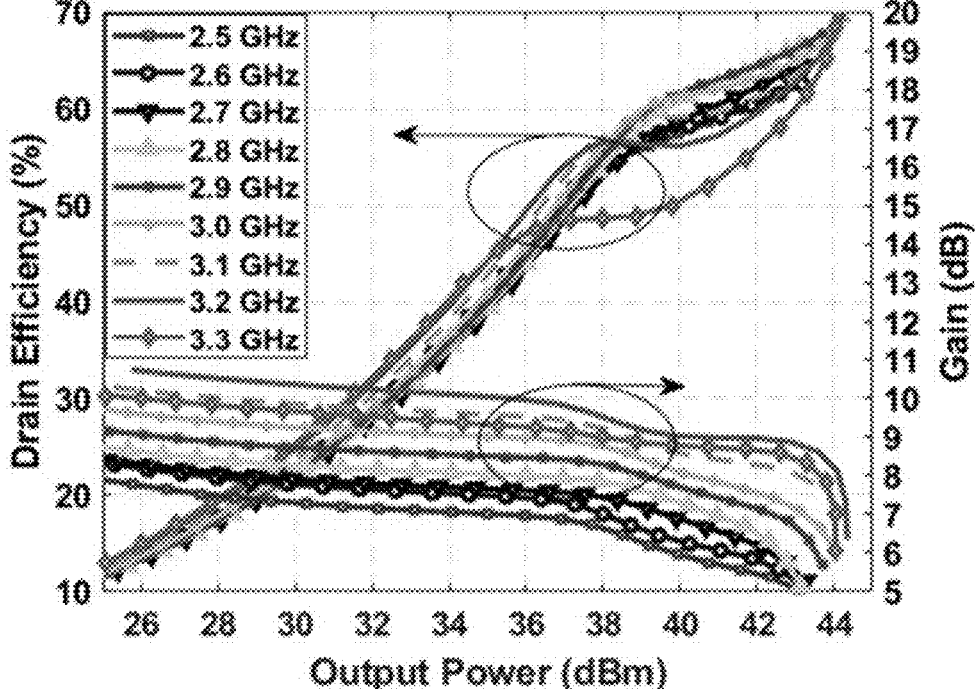
FIG. 15A is a graph 1510 of simulated drain efficiency and gain (simulations)
Figure 15B:
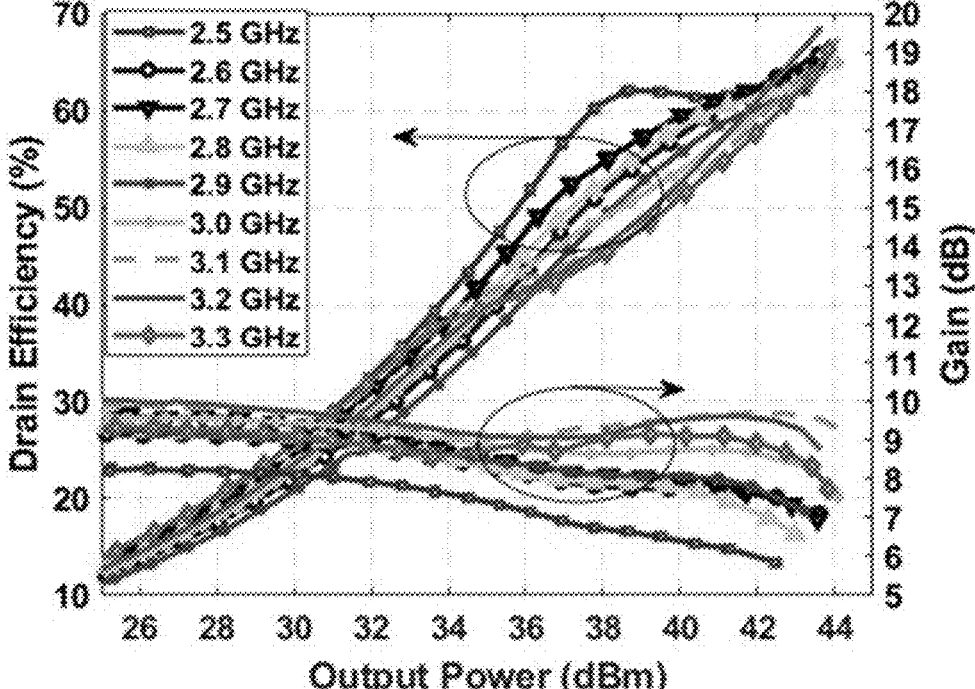
FIG. 15B is a graph 1520 of measured drain efficiency and gain (measurements)
Figure 16A:
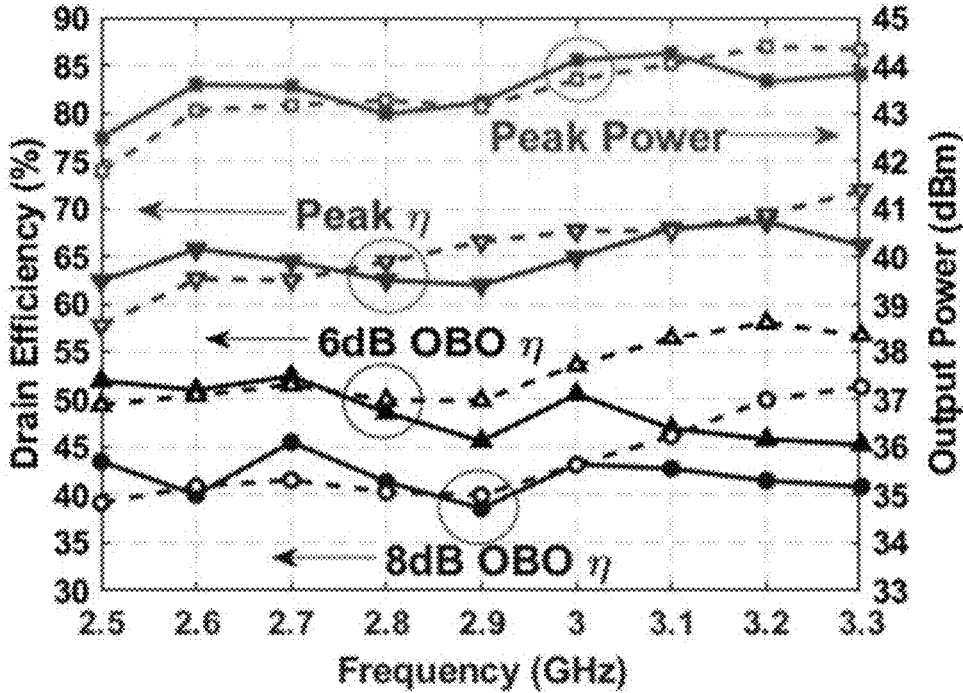
FIG. 16A is a graph 1610 of Measured (solid line) and simulated (dashed line) PA performances using CW signals and after DPD (solid line) CW measurements.

The simulated and measured small-signal performance of the fabricated PA is shown in the graph 1310 of FIG. 13A and the graph 1320 of FIG. 13B. The simulated load modulation trajectories versus frequency seen by the main and auxiliary PAs are shown in the graphs 1410 and 1420 of FIGS. 14A and 14B. It is noted that these simulations are based on the fabrication-ready PA EM model. Then the PA was evaluated from 2.5 to 3.3 GHz using continuous-wave (CW) signals. FIGS. 15A and 15B depicts the graphs 1510 and 1520 simulated and measured drain efficiency and gain versus output power from 2.5 to 3.3 GHz, respectively. Based on the graph 1610 of FIG. 16A, the CW-measured 6-dB backoff drain efficiency is from 45% to 52%, the 8-dB backoff drain efficiency is from 40% to 45%, and the measured saturation power is between 42.5 and 44.2 dBm. The measured data and simulated data are comparable.

Figure 16B:
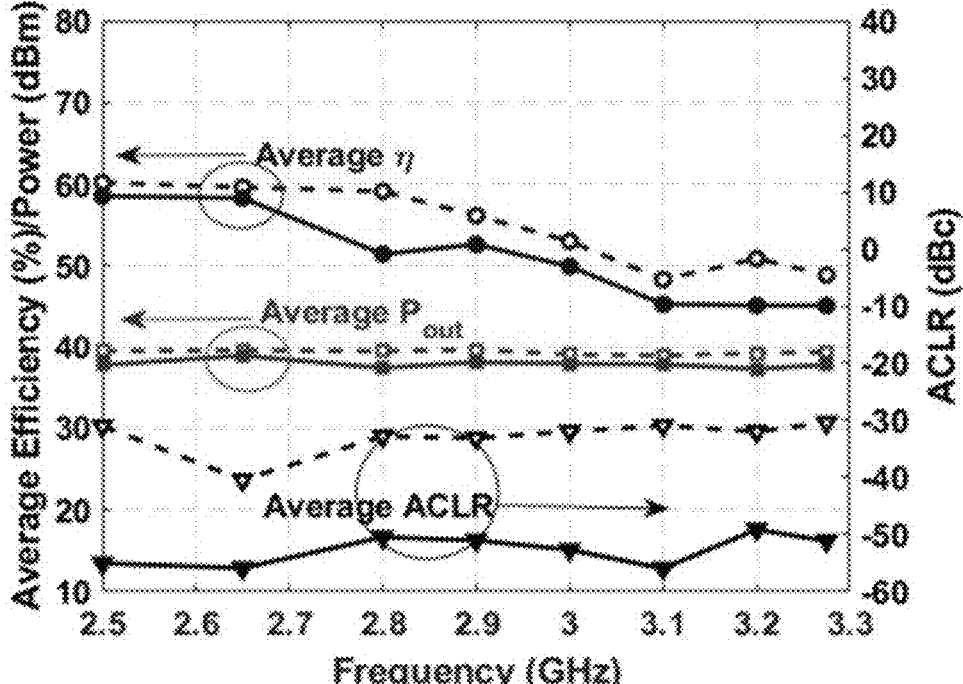
FIG. 16B is a graph 1620 of measured PA performance using 20-MHz LTE signals with 6.1-dB PAPR before (dashed line) and after 20-MHz LTE signal measurements.
Figure 17A:
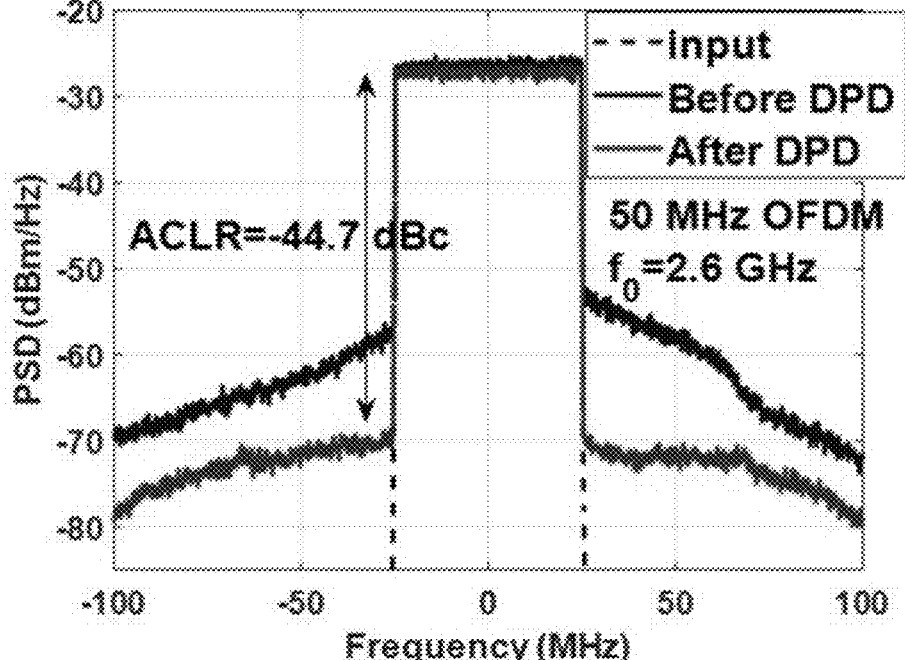
FIGS. 17A-17F are graphs 1710, 1720, 1730, 1740, 1750, and 1760 of output spectral density indicating the ACLR before and after DPD and constellation diagram indicating the EVM before and after DPD at 2.6 GHz, 2.9 GHz, 3.15 GHz, 2.6 GHz, 2.9 GHz, and 3.15 GHz.
Figure 17B:
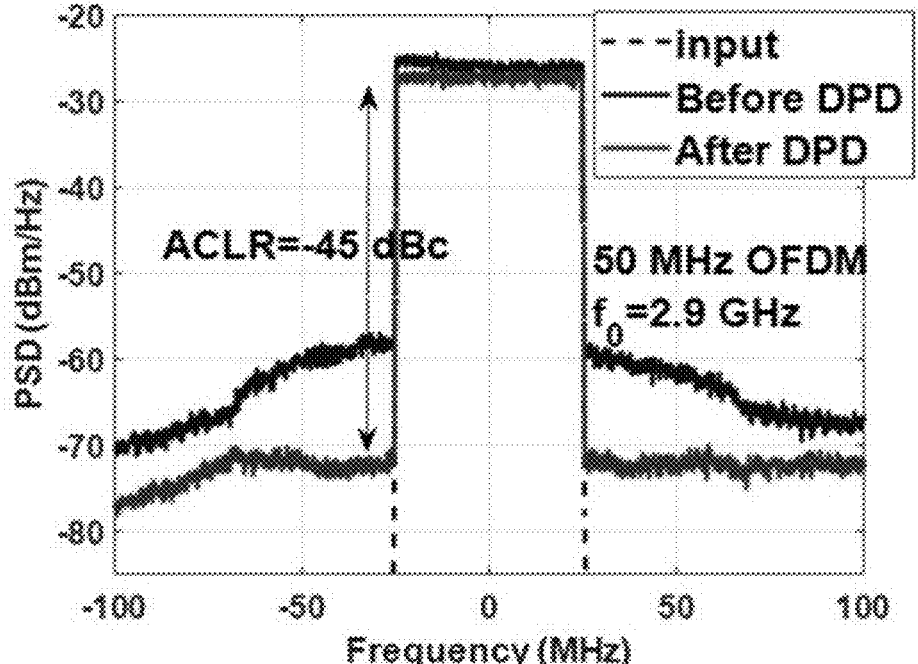
Figure 17C:
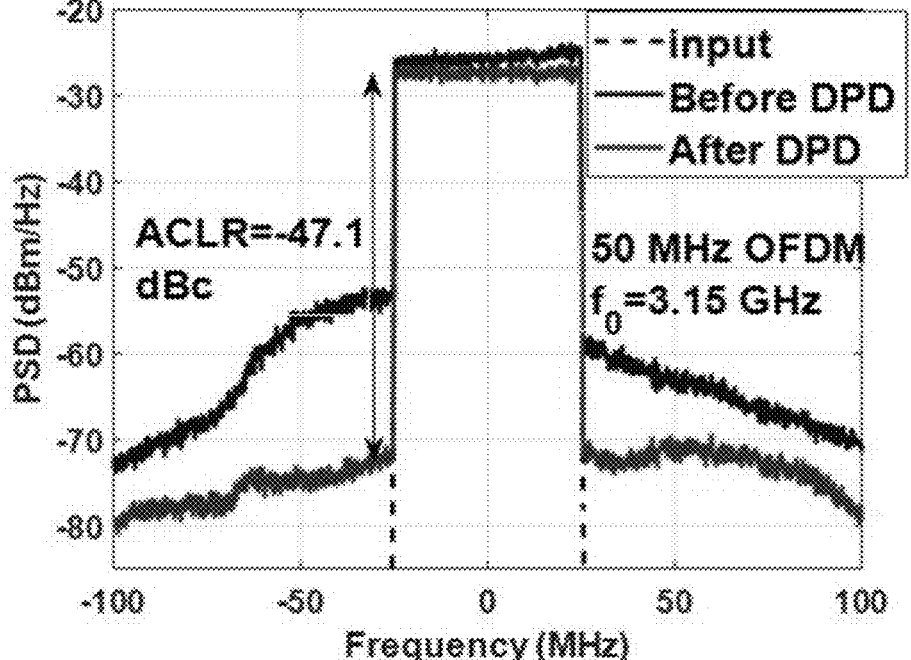
Figure 17D:
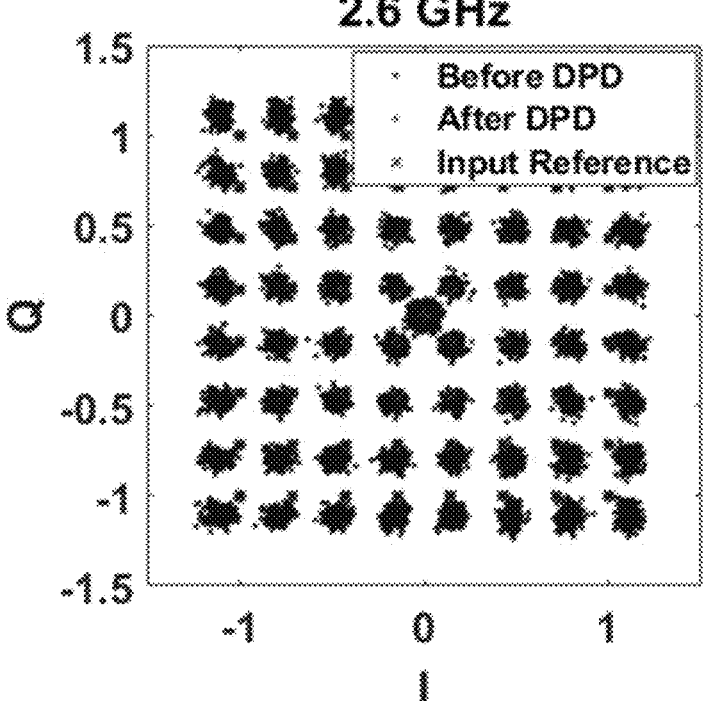
Figure 17E:
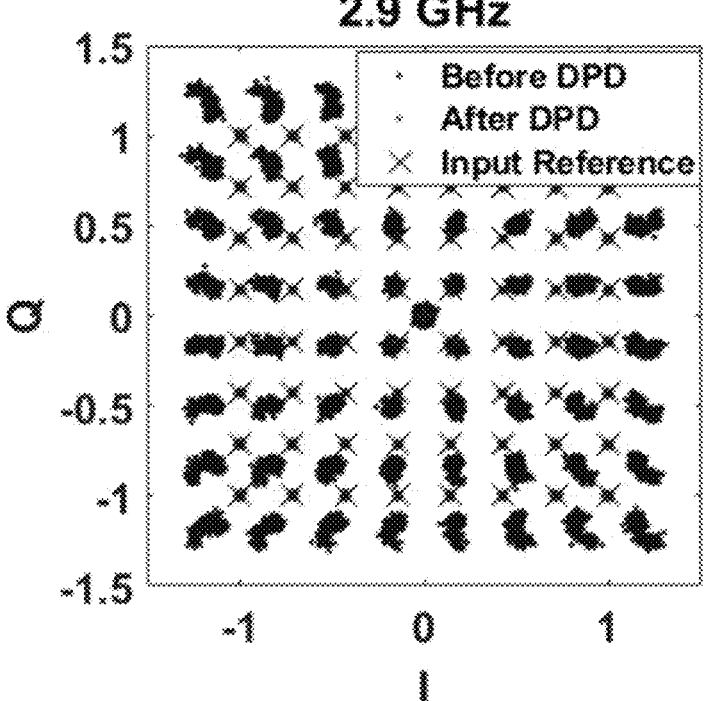
Figure 17F:
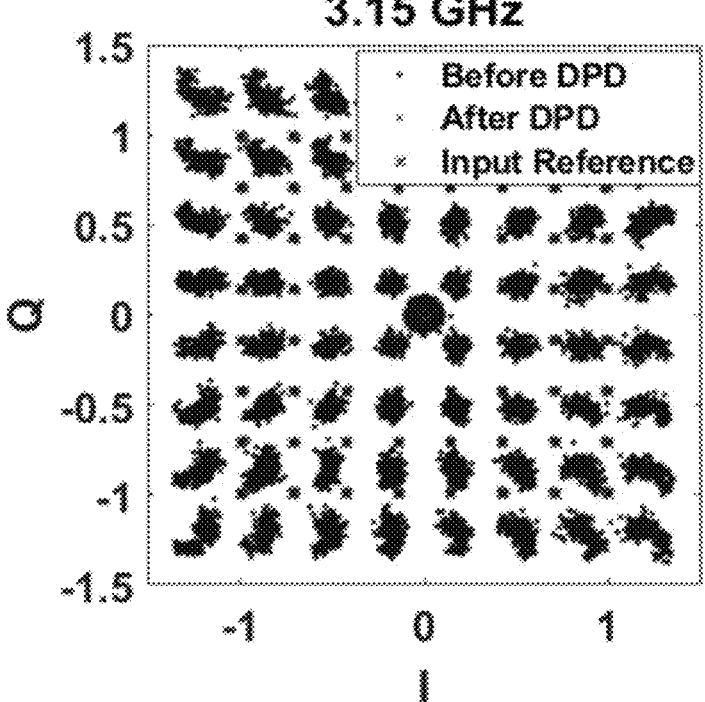

This PA is also evaluated using modulated signals for different carrier frequencies from 2.5 to 3.3 GHz. According to the graph 1620 of FIG. 16B, adjacent channel leakage ratios (ACLRs) less than −50 dBc and average efficiencies from 45% to 59% are observed across the entire frequency band after the digital predistortion (DPD). It is noted that these experiments were conducted using a 20-MHz LTE signal with 6.1-dB peak-to-average-power ratio (PAPR). Furthermore, a 5G-like 50-MHz orthogonal frequency-division multiplexing (OFDM) signal with 10.1-dB PAPR is applied to test the PA's linearity performance at 2.6, 2.9, and 3.15 GHz. The output spectral density and constellation diagrams are shown in the graphs 1710, 1720, 1730, 1740, and 1750, and 1760 of FIGS. 17A-F. It is worth pointing out that there exists asymmetry on the spectrum regrowth of the output spectrum before DPD, which could be obviated by properly designing the baseband impedance and tuning the bias points. The measured performance for this 50-MHz OFDM signal before and after DPD is also summarized in Table II.

TABLE II

| Modulated Signal Measurements Using 50-MHz OFDM Signal | | | | | | |
|---|---|---|---|---|---|---|
| | $f_0$ (GHz) | PAPR (dB) | $P_{out,avg.}$ (dBm) | $n_{avg.}^{\bullet}$ (%) | $ACLR_{L,H}$ (dBc) | NMSE (dB) | EVM (%) |
| Before DPD | 2.6 | 10.2 | 34.6 | 43.9 | −35.4, −31.3 | −17.9 | 5.81 |
| After DPD | 2.6 | 10.2 | 33.8 | 40.7 | −44.4, −44.7 | −37.0 | 1.35 |
| Before DPD | 2.9 | 10.2 | 35.3 | 44.9 | −34.4, −35.9 | −14.6 | 5.25 |
| After DPD | 2.9 | 10.2 | 33.9 | 39.6 | −44.9, −45.0 | −36.6 | 1.47 |
| Before DPD | 3.15 | 10.2 | 34.8 | 38.5 | −30.8, −37.0 | −12.9 | 6.6 |
| After DPD | 3.15 | 10.2 | 33.0 | 33.0 | −47.1, −44.4 | −34.2 | 1.25 |

Numerous characteristics and advantages provided by aspects of the present invention have been set forth in the foregoing description and are set forth in the attached Appendix A together with details of structure and function. While the present invention is disclosed in several forms, it will be apparent to those skilled in the art that many modifications can be made therein without departing from the spirit and scope of the present invention and its equivalents. Therefore, other modifications or embodiments as may be suggested by the teachings herein are particularly reserved.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A power amplifier comprising:
   a single input;
   a first transmission line with a first impedance and a first length;
   a second transmission line with a second impedance and a second length; and
   a frequency-dependent input phase shifter, wherein the input phase shifter is configured to provide a frequency-dependent input phase offset angle ($\theta_{p4}$) at the single input, and wherein the input phase offset angle is calculated based on a peak-to-back drain voltage ($K_{va}$) of an auxiliary power amplifier and an output power back-off range (OBO).

2. The power amplifier of claim 1, wherein the first impedance, first length, second impedance, and second length are selected based on the output power back-off range.

3. The power amplifier of claim 1, wherein the input phase offset angle is calculated using the following formula:

$$\theta_{b4} = -\cos^{-1}\left(-\sqrt{\frac{OBO - K_{va}^2(\omega)}{OBO + 2K_{va}(\omega) + 1}}\right); \theta_{p4} = \pi - \theta_{b4}.$$

4. The method of claim 1, wherein the output power back-off range is 8 db.

5. The power amplifier of claim 1, wherein the power amplifier is a wideband Doherty to HDmax continuum (DHC) power amplifier.

6. The power amplifier of claim 1, wherein the power amplifier is comprised within a wideband DHC-PA output combiner network.

7. The power amplifier of claim 1, further comprising a common load connected between the first transmission line and the second transmission line.

8. A wideband Doherty to HDmax continuum (DHC) power amplifier comprising:

a single input;

a first transmission line with a first impedance and a first length;

a second transmission line with a second impedance and a second length;

a frequency-dependent input phase shifter; and a common load connected between the first transmission line and the second transmission line, wherein the input phase shifter is configured to provide a frequency-dependent input phase offset angle ($\theta_{p4}$) at the single input, and wherein the input phase offset angle is calculated based on a peak-to-back drain voltage ($K_{va}$) of an auxiliary power amplifier and an output power back-off range (OBO).

9. The power amplifier of claim 8, wherein the first impedance, first length, second impedance, and second length are selected based on the output power back-off range.

10. The power amplifier of claim 8, wherein the input phase offset angle is calculated using the following formula:

$$\theta_{b4} = -\cos^{-1}\left(-\sqrt{\frac{OBO - K_{va}^2(\omega)}{OBO + 2K_{va}(\omega) + 1}}\right); \theta_{p4} = \pi - \theta_{b4}.$$

11. The power amplifier of claim 8, wherein the output power back-off range is 8 db.

12. The power amplifier of claim 8, wherein the power amplifier is comprised within a wideband DHC-PA output combiner network.

13. The power amplifier of claim 1, wherein the frequency-dependent input phase shifter comprises a third transmission line with an impedance of approximately 50Ω.

14. The power amplifier of claim 8, wherein the frequency-dependent input phase shifter comprises a third transmission line with an impedance of approximately 50Ω.

* * * * *